US012658266B2

(12) United States Patent
Zhang et al.

(10) Patent No.: US 12,658,266 B2
(45) Date of Patent: Jun. 16, 2026

(54) PATTERN ANALYSIS ENABLED READ OPERATION IN NAND COMPONENT

(71) Applicants: SK Hynix NAND Product Solutions Corp., Rancho Cordova, CA (US); SK hynix Inc., Icheon-si (KR)

(72) Inventors: Ming Zhang, San Jose, CA (US); Yogesh Wakchaure, Folsom, CA (US); Xiaolei Wang, Shanghai (CN); Lei Chen, San Jose, CA (US); Gulzar Kathawala, Fremont, CA (US); Heejoung Park, Seoul (KR); Wanik Cho, Seoul (KR)

(73) Assignees: SK Hynix NAND Product Solutions Corp., Rancho Cordova, CA (US); SK hynix Inc., Icheon-si (KR)

( * ) Notice: Subject to any disclaimer, the term of this patent is extended or adjusted under 35 U.S.C. 154(b) by 148 days.

(21) Appl. No.: 18/694,615

(22) PCT Filed: Jul. 14, 2023

(86) PCT No.: PCT/CN2023/107505
§ 371 (c)(1),
(2) Date: Mar. 22, 2024

(87) PCT Pub. No.: WO2025/015457
PCT Pub. Date: Jan. 23, 2025

(65) Prior Publication Data
US 2025/0246248 A1 Jul. 31, 2025

(51) Int. Cl.
*G11C 16/28* (2006.01)
*G11C 16/08* (2006.01)
*G11C 16/30* (2006.01)

(52) U.S. Cl.
CPC .............. *G11C 16/28* (2013.01); *G11C 16/08* (2013.01); *G11C 16/30* (2013.01)

(58) Field of Classification Search
CPC ......... G11C 16/28; G11C 16/08; G11C 16/30; G11C 29/021; G11C 29/028;
(Continued)

(56) References Cited

U.S. PATENT DOCUMENTS 9,069,659 B1 * 6/2015 Sabbag ............... G11C 11/5642
9,165,647 B1 10/2015 Guliani et al.
(Continued)

FOREIGN PATENT DOCUMENTS

CN 1541393 A 10/2004
CN 114868188 A 8/2022

OTHER PUBLICATIONS

ISR and Written Opinion in PCT/CN2023/107505 Dated Mar. 20, 2024.

*Primary Examiner* — Douglas King
*Assistant Examiner* — Christopher Lane Reece
(74) *Attorney, Agent, or Firm* — HG LAW LLP

(57) ABSTRACT

A method comprises applying a first reference drive voltage to a wordline of memory cells to generate a respective first resulting voltage level from each respective cell in the wordline, and storing in memory a first respective logic value indicated by the respective first resulting voltage level for each memory cell. The method further comprises applying a second reference drive voltage to the wordline of memory cells to generate a respective second resulting voltage level from each respective cell in the wordline while detecting a pattern of logic values stored in the memory in parallel. The memory is modified based on a second respective logic value indicated by the respective second resulting voltage level, and at least one of the first reference drive voltage and the second reference drive voltage is modified based on the detected pattern data.

27 Claims, 10 Drawing Sheets

(58) Field of Classification Search
CPC ........ G11C 16/0483; G11C 2211/5642; G11C
2211/5644; G11C 11/5642; G11C 16/26
See application file for complete search history.

(56) References Cited

U.S. PATENT DOCUMENTS

| 9,286,993 B2 * | 3/2016 | Lasser | ................. G11C 29/021 |
| 11,244,739 B2 * | 2/2022 | Di Vincenzo | ....... G11C 11/2273 |
| 11,322,221 B2 * | 5/2022 | Ohyama | ............. G06F 11/1048 |
| 11,955,991 B2 * | 4/2024 | Shang | ................. G06F 11/1048 |
| 2019/0043564 A1 | 2/2019 | Madraswala et al. | |
| 2022/0115074 A1 | 4/2022 | Teoh et al. | |
| 2025/0110827 A1 * | 4/2025 | Lien | .................... G06F 11/1068 |

* cited by examiner

450

| | R2 | R4 | (~R4) \| R2 | R6 | R6 \| ((~R4) \| R2) |
|---|---|---|---|---|---|
| | 452 | 454 | 456 | 458 | 460 | 462 |
| 000 | 0 | 0 | 1 | 0 | 0 |
| 001 | 0 | 0 | 1 | 0 | 0 |
| 010 | 0 | 0 | 1 | 1 | 1 |
| 011 | 0 | 0 | 1 | 1 | 1 |
| 100 | 0 | 1 | 0 | 1 | 0 |
| 101 | 0 | 1 | 0 | 1 | 0 |
| 110 | 1 | 1 | 1 | 1 | 1 |
| 111 | 1 | 1 | 1 | 1 | 1 |

FIG. 4B

| Step# | Op. Time | Data in SA (SDL) | Data in SDC (TDL) | Data in CDL |
|---|---|---|---|---|
| | | 602 | 604 | 606 |
| 0 | | - | - | Suspended Prog Data |
| 1a | Latch Xfer | - | Suspended Prog Data | - |
| 1b | R2 sense | R2 data | Suspended Prog Data | - |
| 2 | | R2 data | Suspended Prog Data | R2 data |
| 3a | Bit Counting | - | Suspended Prog Data | R2 data (Counting) |
| 3b | R4 sense | R4 data | Suspended Prog Data | R2 data |
| 4 | | R4 data | Suspended Prog Data | R2+R4 data |
| 5a | Bit Counting | - | Suspended Prog Data | R2+R4 data (Counting) |
| 5b | R6 sense | R6 data | Suspended Prog Data | R2+R4 data |
| 6 | | - | Suspended Prog Data | R2+R4+R6 data (Final) |
| 7a | Latch Xfer | Suspended Prog Data | - | R2+R4+R6 data (Final) |
| 7b | Bit Counting | Suspended Prog Data | - | R2+R4+R6 data (Counting) |
| 8 | Latch Xfer | Suspended Prog Data | R2+R4+R6 data (Final) | R2+R4+R6 data (Counting) |
| 9a | Data-Out | Suspended Prog Data | Data clock out | R2+R4+R6 data (Counting) |
| 9b | Latch Xfer | - | Data clock out | Suspended Prog Data |

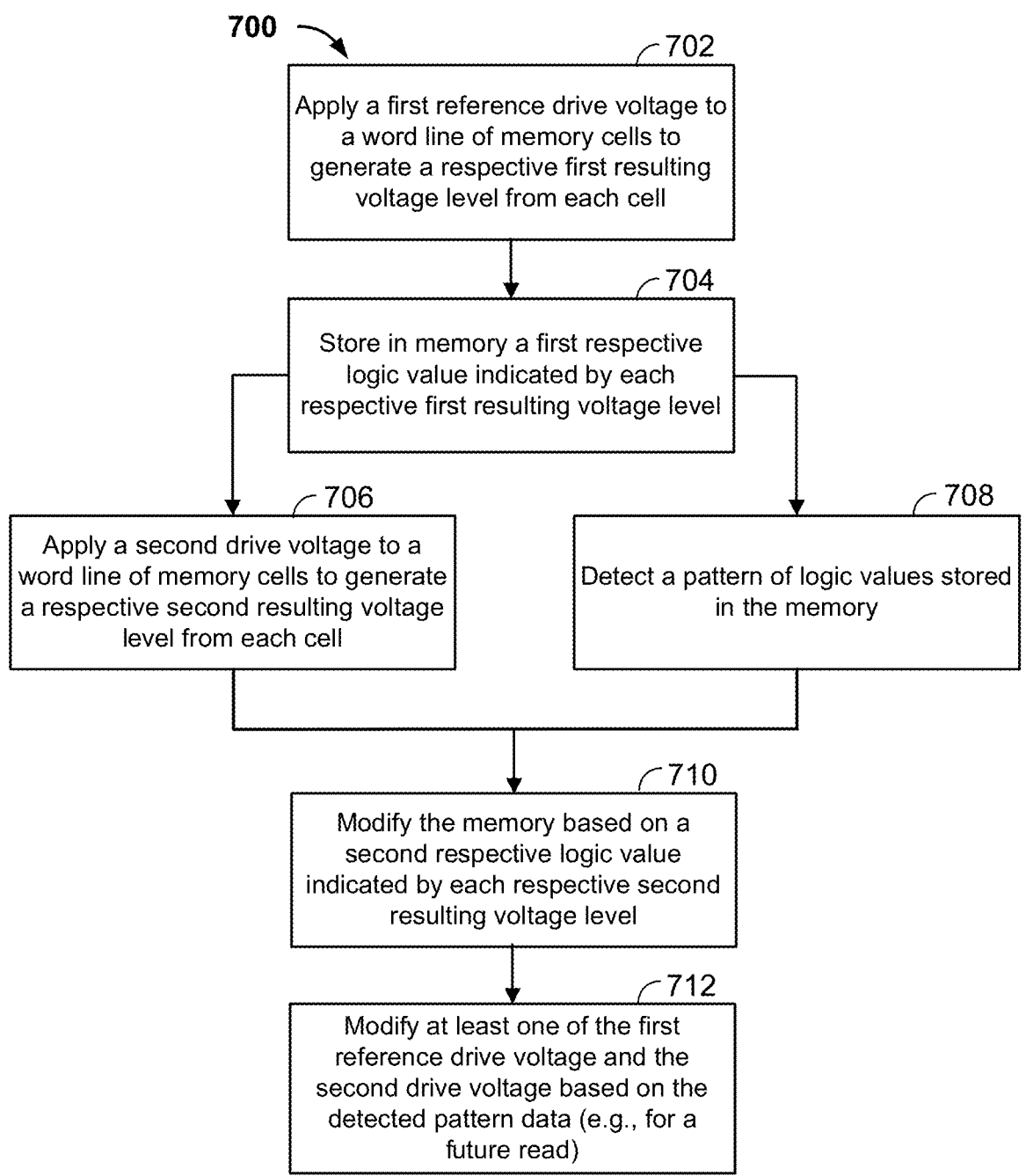

700

702

Apply a first reference drive voltage to a word line of memory cells to generate a respective first resulting voltage level from each cell

704

Store in memory a first respective logic value indicated by each respective first resulting voltage level

706

Apply a second drive voltage to a word line of memory cells to generate a respective second resulting voltage level from each cell

708

Detect a pattern of logic values stored in the memory

710

Modify the memory based on a second respective logic value indicated by each respective second resulting voltage level

712

Modify at least one of the first reference drive voltage and the second drive voltage based on the detected pattern data (e.g., for a future read)

FIG. 7

PATTERN ANALYSIS ENABLED READ OPERATION IN NAND COMPONENT

INTRODUCTION

The present disclosure is directed to detecting patterns in data output by applying a read reference voltage to a wordline of memory cells, and in particular is directed to detecting patterns in intermediate data output by the wordline after application of each reference voltage when a plurality of reference voltages are used in a single bit read operation.

SUMMARY

In some memory devices, a memory cell is capable of storing more than one bit per cell. For example, a triple-level cell (TLC) memory may store a total of three bits, with a total of eight different possible voltage levels representing each combination of bits. In order to determine the stored bit values, one or more reference drive voltages may be used. For example, in TLC memory, reading the most significant bit (MSB) may require only one reference drive voltage, but reading the central significant bit (CSB) may require three different reference drive voltages.

However, as a memory cell goes through more read/write operations, the stored voltage corresponding to a particular combination of bits may shift, and using the one or more reference drive voltages to determine the stored bit values may result in an erroneous reading. In some approaches, in response to detecting an erroneous read (e.g., by a Cyclic Redundancy Check (CRC) on output bit values), a plurality of read retry voltages may be substituted as the reference drive voltages, or an Automatic Reference Counting (ARC) process may be utilized to modify the reference voltages. Both processes, however, require processing time that may delay read/write operations (e.g., from the memory device to a host device).

In accordance with some embodiments of the present disclosure, method and systems are provided herein for dynamically selecting the reference drive voltages based on sensed patterns in an output of a wordline of memory cells before the single bit is read (e.g., during application of 1st and 2nd reference out of 3 voltages required to read the CSB of a 3 bit cell). In some embodiments, the sensed pattern based on a first reference drive voltage may be detected while a second reference drive voltage is input in the read process. In some embodiments, a second sensed pattern based on the first and second reference drive voltages may be a detected while a third reference drive voltage is input in the read process. In some embodiments, there may be any number between two and seven of reference drive voltages, wherein each sensed pattern corresponds to a respective applied drive voltage.

It should be noted that the "first" reference drive voltage and "second" reference drive voltage as described herein are meant to describe the order in which such voltages are applied, and are not limited to specifically refer to only the first actual reference voltage and second actual reference voltage applied to a wordline of memory cells to read one of the bit positions. For example, in a memory cell that stores three bits "first" reference drive voltage may refer to a first actual reference voltage or to a second actual reference voltage, and the "second" reference drive voltage may refer to a second actual reference voltage or to a third actual reference voltage, respectively.

In another example in which reading a bit in a memory cell (e.g., that stores at least two bits) requires, for instance, seven reference drive voltages, the first reference drive voltage may refer to any of first through sixth actual reference voltages, and the second reference drive voltage refer to any of second through seventh actual reference voltages. More generally for any cell that stores at least two bits, for a read operation (e.g., on one of the stored bits) requiring n+1 reference drive voltages, the "first" reference drive voltage may refer to any of the first through nth actual reference drive voltage, and the "second" reference drive voltage refers to the actual reference drive voltage that is subsequently applied after the "first" reference drive voltage, as shown in the table below:

| "First" Reference Drive Voltage | "Second" Reference Drive Voltage |
|---|---|
| $1^{st}$ actual reference voltage | $2^{nd}$ actual reference voltage |
| $2^{nd}$ actual reference voltage | $3^{rd}$ actual reference voltage |
| . . . | . . . |
| nth actual reference voltage | (n + 1)th actual reference voltage |

In some embodiments, a method to allow for reading data from memory comprises applying a first reference drive voltage to a wordline of memory cells to generate a respective first resulting voltage level from each respective cell in the wordline. For each respective first resulting voltage level output by each cell in the wordline, a first respective logic value indicated by the respective first resulting voltage level is stored in a memory (e.g., a respective latch coupled to each respective memory cell). The method further comprises applying a second reference drive voltage to the wordline of memory cells to generate a respective second resulting voltage level from each respective cell in the wordline, while also detecting a pattern of logic values stored in the memory. For each respective second resulting voltage level output by each cell in the wordline, the memory is modified based on a second respective logic value indicated by the respective second resulting voltage level. At least one of the first reference drive voltage and the second reference drive voltage is modified based on the detected pattern data. In some embodiments utilizing more than two reference drive voltages, the method further comprises applying each additional reference voltage to the wordline of memory cells to generate a respective additional resulting voltage level from each cell in the wordline to be stored in the memory. The method further comprises detecting a pattern of logic values in the memory while each additional reference is being applied, wherein the respective pattern of logic values in the memory is detected before the new additional resulting voltage levels are stored in the memory.

In accordance with some embodiments of the present disclosure, a system comprises a memory, a wordline of memory cells configured to store data, and control circuitry. The control circuitry is configured to apply a first reference drive voltage to the wordline of memory cells to generate a respective first resulting voltage level from each respective cell in the wordline. For each respective first resulting voltage level output by each cell in the wordline, the control circuitry stores in the memory a first respective logic value indicated by the respective first resulting voltage level. The control circuitry then applies a second reference voltage to the wordline of memory cells to generate a respective second resulting voltage level from each respective cell in the wordline, while also detecting a pattern of logic values stored in the memory. For each respective second resulting voltage level output by each cell in the wordline, the control circuitry then modifies the memory based on a second respective logic value indicated by the respective second resulting voltage level. Based on the detected pattern data, the control circuitry is further configured to modify at least one of the first reference drive voltage and the second reference drive voltage. Modifying the at least one reference drive voltages may occur, for example, when an erroneous read operation occurs (e.g., where the erroneous read may be detected by a Cyclic Redundancy Check (CRC) or other suitable process). In some applications without pattern detection of intermediate reference drive voltages, when an erroneous reading occurs a read retry process is performed to recalibrate the reference drive voltages. However, with only a final read operation output, all of the reference drive voltages are retried until a combination of reference voltages successfully returns the correct bits (e.g., the read retry process may be repeated multiple times), and each retry is an additional read operation. As more retries occur, the lag time for the originally request read operation increases. Therefore, by obtaining intermediate data output from each respective reference drive voltage instead of only a final read operation output, processes to recalibrate the reference drive voltages (e.g., when an erroneous read occurs) are simplified and require less retries, reducing overhead lag time for read operations.

BRIEF DESCRIPTION OF THE DRAWINGS

The present disclosure, in accordance with one or more various embodiments, is described in detail with reference to the following figures. The drawings are provided for purposes of illustration only and merely depict typical or example embodiments. These drawings are provided to facilitate an understanding of the concepts disclosed herein and should not be considered limiting of the breadth, scope, or applicability of these concepts. It should be noted that for clarity and ease of illustration, these drawings are not necessarily made to scale.

FIGS. 4A-4B depict a central significant bit (CSB) read process for a triple-level cell (TLC) flash memory cell, without a pattern detecting process, in accordance with some embodiments of the present disclosure;

FIGS. 6A-6B show illustrative flowcharts of a read process with a pattern detection process occurring during a program suspend, in accordance with some embodiments of the present disclosure;

FIG. 7 shows an illustrative flowchart of steps for dynamically modifying one or more read reference drive voltages based on detected pattern data, in accordance with some embodiments of the present disclosure.

DETAILED DESCRIPTION

In a memory device including a wordline of memory cells, a plurality of reference drive voltages may be used to determine stored bit values in the memory cells. However, as a memory cell goes through more read/write operations, the stored voltage corresponding to a particular combination of bits may shift, and using the one or more reference drive voltages to determine the stored bit values may result in a sticky or erroneous reading.

In accordance with some embodiments of the present disclosure, method and systems are provided herein for dynamically selecting the reference drive voltages based on detected patterns for each reference drive voltage applied to a wordline of memory cells. The method and systems provided herein may be utilized to dynamically select or detect patterns for two more reference drive voltages. In some embodiments, the pattern based on a first reference drive voltage may be detected while a second reference drive voltage is input in the read process. In some embodiments utilizing at least a third reference drive voltage, a second sensed pattern based on the first and second reference drive voltages may be a detected while a third reference drive voltage is input in the read process. In some embodiments utilizing more than three reference drive voltages, the process may be reiterated until each respective reference drive voltage has been input in the read process. The present disclosure is directed to reducing overhead lag time during a read operation when an erroneous read occurs.

Figure 1:
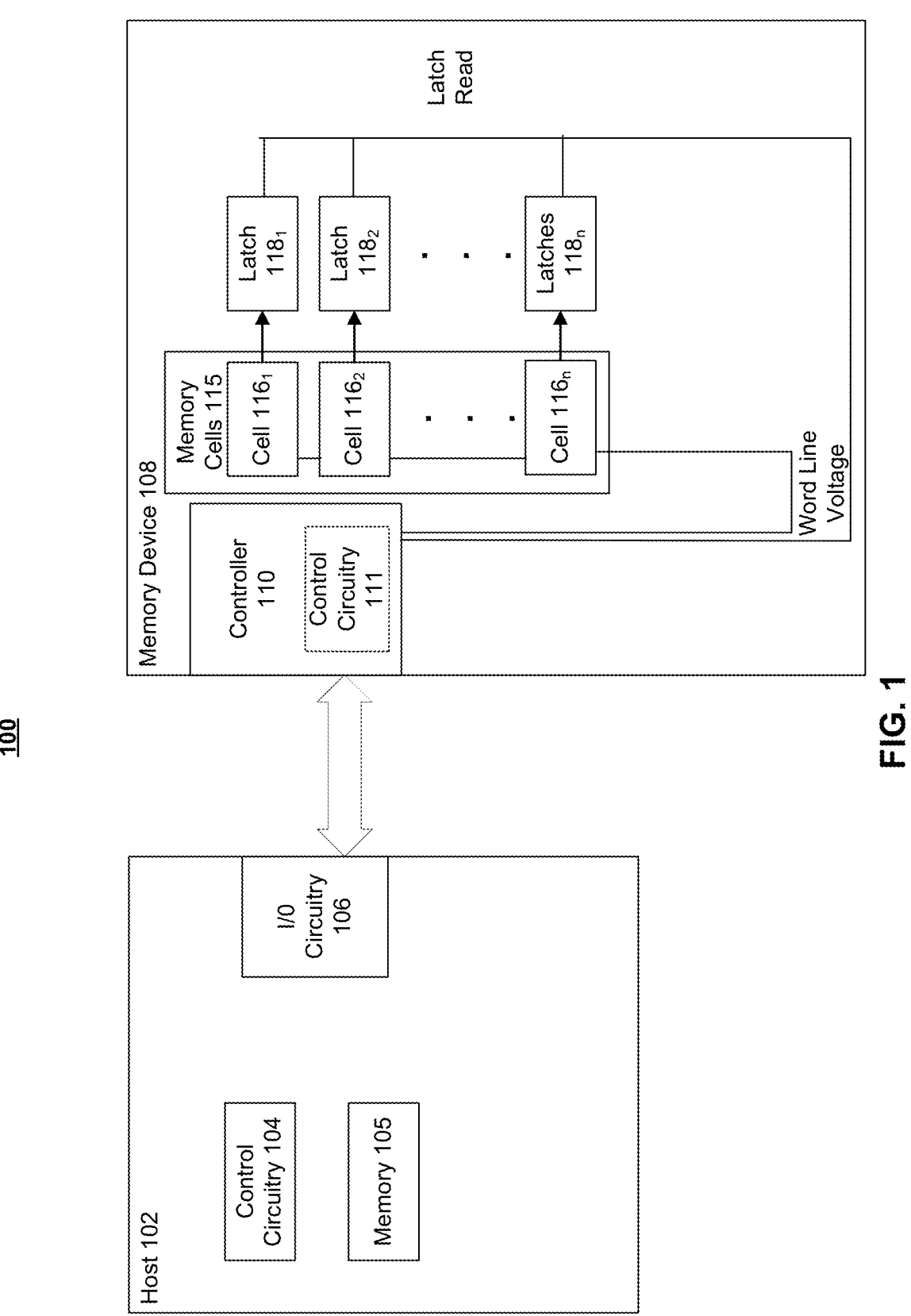
FIG. 1 shows a block diagram of a system that includes a host communicatively coupled to a memory device, in accordance with some embodiments of the present disclosure.

FIG. 1 shows a block diagram of a system 100 that includes a host device 102 communicatively coupled to a memory device 108, in accordance with some embodiments of the present disclosure. Host device 102 may be, for example, a computer (e.g., with onboard memory device 108) or any other suitable computing device utilizing read and/or write operations from a memory. As shown, the host device 102 is coupled to memory device 108. In some embodiments, memory device 108 may be inside host 102, or memory device 108 may be external to host 102. In some embodiments, the devices may be coupled through one or more busses using non-volatile memory express (NVMe) over peripheral component interconnect express (PCIe). However, it should be understood that any other suitable protocols or combinations of protocols may be used. For example, such a protocol may include serial attached small computer system interface (SAS), serial advanced technology attachment (SATA), any other suitable protocol, or any combination thereof.

Host device 102 includes control circuitry 104, memory 105, and input/output (I/O) circuitry 106, although it will be understood that host device 102 may have other components included in other suitable embodiments. For example, control circuitry 104 may be included in a controller, where the controller may include one or more central processing units (CPUs), or other configurable controller such as one or more programmable logic arrays (PLAs), one or more field programmable gate arrays (FPGAs), one or more complex programmable logic devices (CPLDs), any other suitable controller circuitry, or any combination thereof. The memory 105 may include random access memory (RAM), read only memory (ROM), programmable ROM (PROM), firmware, flash memory, any other suitable memory, or a combination thereof. In some embodiments, the I/O circuitry 106 may include a PCIe adapter to communicatively couple (e.g., using NVMe over PCIe protocol) the host device 102 and the memory device 108 (e.g., through one or more busses). In some embodiments, the host device 102 may store information (e.g., from a user utilizing host device 102, an external server, an operating system, other suitable applications, or a combination thereof) in memory device 108 through I/O circuitry 106.

Memory device 108 includes a controller 110 and a wordline of memory cells 115, where each cell $116_1$-$116_n$ is coupled to a respective series of latches $118_1$-$118_n$. While only one wordline is shown for ease of reference, in some embodiments memory device 108 may include multiple wordlines. In some embodiments, the wordline of memory cells 115 may include 18,000 cells (e.g., where n is equal to 18,000, and the wordline of memory cells 115 includes cells $116_1$-$116_{18000}$), 20,000 cells, or any other suitable number of cells. Controller 110 includes control circuitry 111, where the control circuitry 111 is configured to read and write data to and from the wordline of memory cells 115 by, for example, providing one or more reference drive voltages to the wordline of memory cells 115. In some embodiments, read and write operations in the memory device 108 occur when a corresponding command is received from host device 102 (e.g., via I/O circuitry 106). In some embodiments, cells $116_1$-$116_n$ may be triple-level cell (TLC) flash memory cells. In some embodiments, a TLC flash memory cell may store a voltage corresponding to a combination of three bits (e.g., a most significant bit, a central significant bit, and a least significant bit). In some embodiments, a flash memory cell may include any number from two to seven bits, and may store a number of different voltages corresponding to a total number of combinations of the number of bits stored. The eight different combinations of the three bits may be represented, in an ideal TLC flash memory, by eight discrete voltage levels stored in the TLC flash memory. However, it is understood by one skilled in the art that as read/write operations are performed on the TLC flash memory, the discrete voltages corresponding to each of the combinations of the three stored bits may change or shift over time.

Cells $116_1$-$116_n$ may be coupled with respective latches $118_1$-$118_n$. In some embodiments, each latch $118_1$-$118_n$ may include a sense-amp data latch (SDL), a transfer data latch (TDL), a counting-capable data latch (CDL), or a combination thereof. Latches $118_1$-$118_n$ may store information (e.g., bit data) contained in respective cells $116_1$-$116_n$. In some embodiments, reading data from the wordline of memory cells 115 may include reading the data in the latches $118_1$-$118_n$ in a latch read operation. For example, the latch read may be performed by control circuitry 111 onboard memory device 105.

In some embodiments, reading data from the wordline of memory cells 115 includes configuring the control circuitry 111 to apply one or more reference drive voltages to each memory cell $116_1$-$116_n$. In some applications where a plurality of bits are stored in each memory cell $116_1$-$116_n$, it is possible to utilize a plurality of drive voltages and logical bitwise operations in order to determine a value of a specific bit. For example, provided herein (e.g., described below in FIGS. 3-5) are examples directed to reading a central significant bit (CSB) in a TLC flash memory cell. However, it should be appreciated by one skilled in the art that similar operations may occur in suitable embodiments that include more or less than three bits stored per memory cell, determining values of different bits (e.g., a most significant bit, or a least significant bit, other bits stored in each memory cell, or a combination thereof), or a combination thereof.

As described previously, the first reference drive voltage and second reference drive voltage as described herein are relative, and are not limited to specifically refer to only the first actual reference voltage and second actual reference voltage applied to a wordline of memory cells. For example, in a memory cell that stores seven bits, the first reference drive voltage and second reference drive voltage as described herein may refer to a second actual reference voltage and a third actual reference voltage, respectively, a third actual reference voltage and a fourth actual reference voltage, respectively, a sixth reference voltage and a seventh actual reference voltage respectively, or any nth actual reference voltage and (n+1)th actual reference voltage, respectively. In some embodiments that include multiple iterations or pairs of reference drive voltages, the relative first reference drive voltage and second reference drive voltage described herein may refer to different actual reference voltages at each iteration or pairing. For example, in a memory cell that stores seven bits, the method described herein utilizing a first reference drive voltage and a second reference drive voltage may first be applied to a first actual reference drive voltage and a second actual reference drive voltage, respectively, and then be applied to a second actual reference drive voltage and a third actual reference drive voltage, respectively, any suitable nth actual reference drive voltage and (n+1)th actual reference drive voltage, or a combination thereof. Similarly, the third reference drive voltage as described herein is also relative, and if the first reference drive voltage represents a nth actual reference drive voltage, then the third reference drive voltage may represent a (n+2)th actual reference drive voltage. For example, if the first reference drive voltage represents a fifth actual reference voltage, then the third reference drive voltage represents a seventh actual reference voltage. Therefore, while the following may be described in the context of a CSB read of a wordline of TLC flash memory cells, it will be understood that, particularly when the present disclosure is applied to memory cells that store more than three bits, that the first reference drive voltage, second reference drive voltage, and third reference drive voltage may refer to any nth actual reference drive voltage, (n+1)th actual reference drive voltage, and (n+2)th actual reference drive voltage, respectively.

Figure 2:
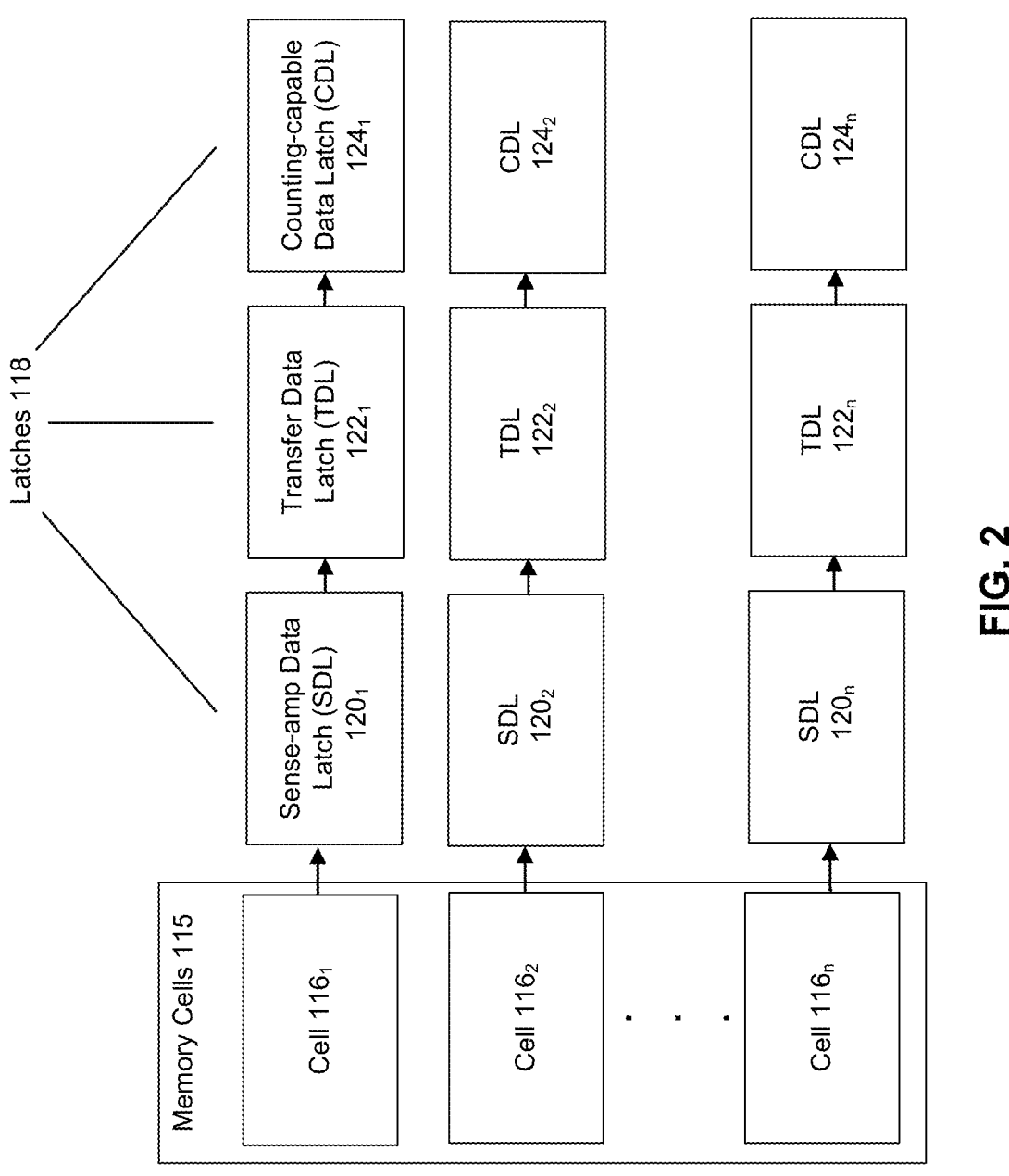
FIG. 2 shows a block diagram of a wordline of memory cells coupled to a respective series of latches, in accordance with some embodiments of the present disclosure.

FIG. 2 shows a block diagram of a wordline of memory cells 115 coupled to a respective series of latches $118_1$-$118_n$, in accordance with some embodiments of the present disclosure. As shown, each latch of the series of latches $118_1$-$118_n$ may include a respective sense-amp data latch (SDL) $120_1$-$120_n$, a respective transfer data latch (TDL) $122_1$-$122_n$, and a respective counting-capable data latch (CDL) $124_1$-$124_n$. It will be understood that other combinations of latches may be suitable in other embodiments, and that each latch $118_1$-$118_n$ may include additional latches.

Sense-amp data latch $120_1$ may be configured to receive bit data from cell $116_1$ as a voltage, and to amplify the received voltage. In some embodiments, cell $116_1$ may include any number from two to seven bits. For example, cell $116_1$ may be a TLC flash memory, and accordingly includes three different bits of data. When data is read from cell $116_1$, each bit may be read by utilizing one or more reference drive voltages. Using the previous example where cell $116_1$ is a TLC flash memory, reading the central significant bit (CSB) may utilize three reference drive voltages (e.g., wherein the three reference drive voltages may be referred to herein as a first reference drive voltage R2, a second reference drive voltage R4, and a third reference drive voltage R6), with each applied reference drive voltage outputting a bit (e.g., either 0 or 1) to the SDL $120_1$, wherein a 0 corresponds to a first output voltage, and a 1 corresponds to a second output voltage that has a separate and discrete value from the first output voltage. However, because the first output voltage and the second output voltage may have a small difference in value, the SDL $120_1$ may amplify the output so that there is a larger difference in value separating the first output voltage and the second output voltage (e.g., to prevent read errors).

The output bit value (e.g., represented by the amplified voltage level) is then sent to the transfer data latch (TDL) $122_1$, which may function as a temporary memory to hold the output bit value. In some embodiments, the TDL $122_1$ may hold the output bit value until a latch read occurs. As described in FIG. 1, a latch read may be executed by, for example, control circuitry 111, and the latch read may include reading the data in the TDL $122_1$. In some embodiments, a previously stored bit value in TDL $122_1$ may be compared to a new bit value received from SDL $120_1$. For example, a comparison may occur when multiple reference drive voltages are utilized for a bit read (e.g., reading the CSB). An illustrative example of a comparison process is described in FIG. 4B.

In accordance with some embodiments of the present disclosure, latch $118_1$ may further include a counting-capable data latch (CDL) $124_1$. The CDL $124_1$ may receive the bit value stored in TDL $122_1$. In some embodiments, a latch read (e.g., executed by control circuitry 111, as described in FIG. 1) may read the bit value stored in CDL $124_1$ instead of the data stored in TDL $122_1$. In some embodiments, a latch read may read the data stored in TDL $122_1$, and the data stored in CDL $124_1$ may instead be read as part of a different pattern detecting process executed by the control circuitry 111.

Although only latch $118_1$ that includes SDL $120_1$, TDL $122_1$, and CDL $124_1$ is described, it will be understood that the respective latches corresponding to the other cells $116_2$-$116_n$ are similar to the latches described above. Therefore, a pattern detecting process may count a total number of logical one bits, a total number of logical zero bits, or a combination thereof across all of the CDLs in the wordline of memory cells 115. Moreover, in accordance with some embodiments of the present disclosure, the pattern detecting process may occur at the same time as a read process (e.g., that utilizes a plurality of reference drive voltages), a comparison process (at the TDL), or a combination thereof.

In applications without a pattern detecting process, a read operation (e.g., requested by a host device 102) performed by the memory device 105 may return the requested bits from each cell of the wordline of memory cells, but will not return intermediate data (e.g., outputs resulting from each applied reference drive voltage, outputs resulting from logical bitwise operations, or a combination thereof). However, as explained in FIG. 1, as read/write operations are performed on the TLC flash memory, the discrete voltages corresponding to each of the combinations of the three stored bits may change or shift over time. If the reference drive voltages are not correspondingly altered, an erroneous reading may occur. When an erroneous reading is detected (e.g., by a Cyclic Redundancy Check (CRC) on output bit values) and a subsequent retry process is applied to select different reference drive voltages, the memory device 105 may have little to no information about which reference drive voltage is erroneous, or which intermediate step returns an incorrect result. Therefore, the controller onboard the memory device (e.g., controller 110) retries with a set of predetermined reference drive voltage levels, based on prior trends and patterns observed in the shift over time of the stored voltage levels, which has low precision and may result in a large number of performed retries (e.g., corresponding to a large overhead lag time in the requested read operation). By performing pattern analysis and/or bit counting on outputs for each reference drive voltage, it may be easier to deduce which reference drive voltage and/or step in the read operation caused an erroneous reading, resulting in a higher accuracy in the read retry process (e.g., less retries needed, resulting in less lag time). Furthermore, as described below, the pattern analysis process occurs in tandem with the read operation, resulting in little to no additional overhead lag time from the pattern analysis process itself (although more processing power and/or an additional latch (e.g., a CDL) is needed for each memory cell).

Figures 3A, 3B:
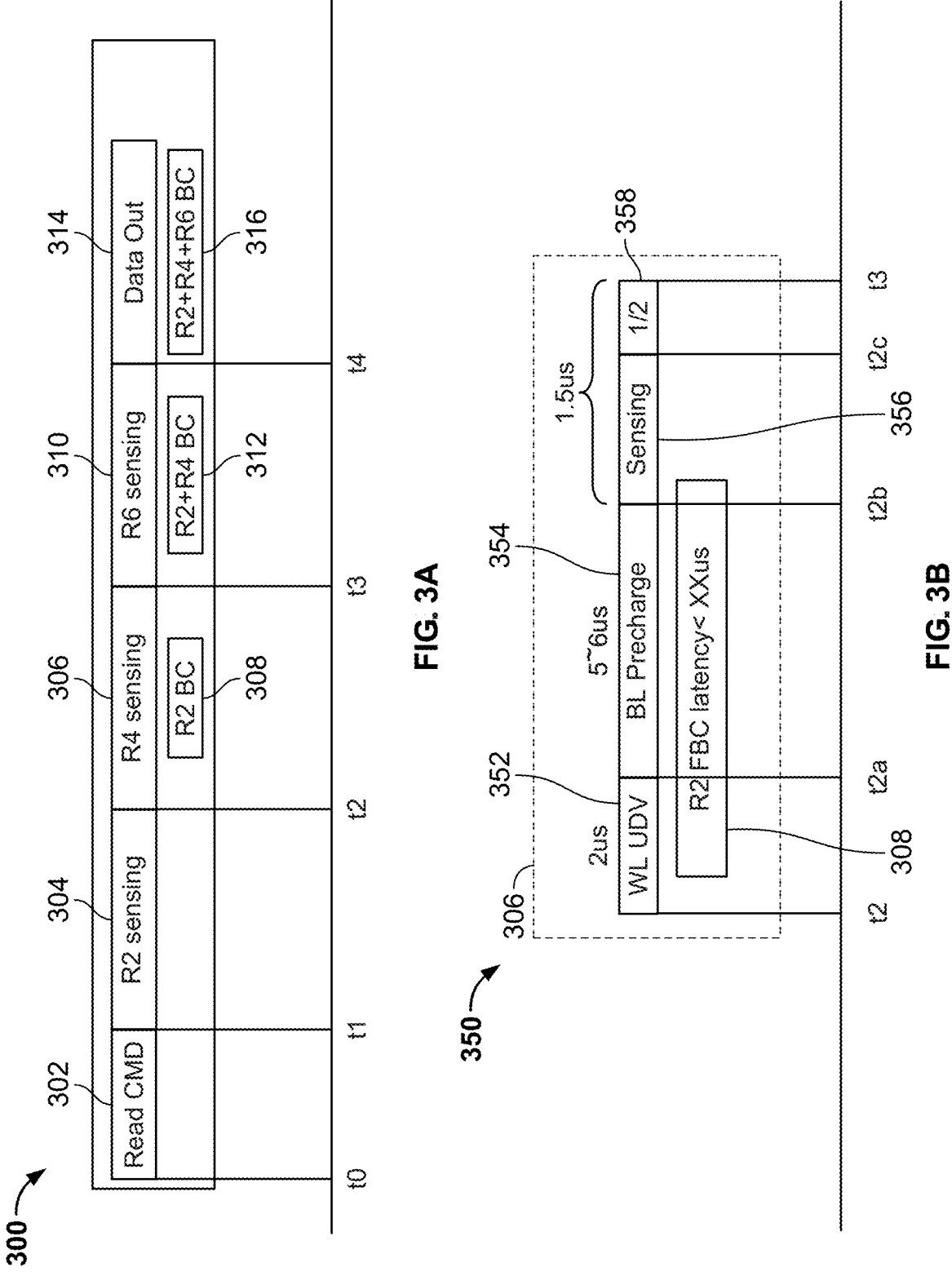
FIG. 3A depicts an illustrative timeline of a central significant bit read process and corresponding pattern detecting processes for a wordline of memory cells, in accordance with some embodiments of the present disclosure.
FIG. 3B depicts an illustrative timeline of a sensing process for a second reference voltage as described in FIG. 3A, in accordance with some embodiments of the present disclosure.

FIG. 3A depicts an illustrative timeline of a central significant bit read process 300 and corresponding pattern detecting processes for a wordline of memory cells, in accordance with some embodiments of the present disclosure. FIG. 3A depicts an example of the method and systems explained in FIGS. 1 and 2, in applications directed to reading respective CSBs of a wordline of TLC flash memory cells (e.g., each memory cell having 3 bits stored). Although FIG. 3A is described in the context of the particular structures, components, and processing of the present disclosure, and it will be understood that in some embodiments, one or more of the processes described in FIG. 3A may be modified, moved, removed, or added, for different bit reads (e.g., MSB, LSB, other suitable bits, or a combination thereof) and/or different types of memory cells (e.g., storing different numbers of bits per cell).

At time t0, a read command 302 is received and processed, where read command 302 may be provided by a host external to the memory device (e.g., host device 102). In some embodiments, the read command 302 may be processed and then executed by control circuitry 111, an external controller, or a combination thereof. At time t1, a first reference drive voltage R2 is applied to the wordline of memory cells in an R2 sensing process 304, and the output bits from each memory cell may be sent to, for example, the respective SDL as described in FIG. 2. As described above, a TLC flash memory cell may store eight discrete voltage levels, with each voltage level corresponding to a different combination of three binary bits, and three reference drive voltages are needed to read the value of the CSB. When a reference drive voltage is applied, a voltage corresponding to a logical zero is returned (e.g., output to a SDL) if the voltage level stored in the TLC flash memory is higher than the applied reference drive voltage, and a voltage corresponding to a logical one is returned if the voltage level stored in the TLC flash memory is lower than the applied reference drive voltage. In some embodiments, the logical value may be determined to be zero if any output voltage is detected, and if an output voltage is not detected, then a logical one may be determined. In some embodiments, the logical value may be determined to be one if any output voltage is detected, and if an output voltage is not detected, then a logical zero may be determined. The return voltage is amplified at the SDL (e.g., to more clearly differentiate between a logical zero and a logical one) and sent to the TDL and CDL.

At time t2, the output bits for each cell from R2 sensing process 304 is completed, and a second reference drive voltage R4 is applied to the wordline of memory cells in an R4 sensing process 306. Similar to the R2 sensing process 304, the output bits from each memory cell in response to the applied second reference drive voltage R4 may be sent to the respective SDL to be amplified. Once the data is amplified at the SDLs, additional operations may be needed in order to correctly read and return a bit value stored in the memory (e.g., the CSB). In some embodiments, the additional operations may be bitwise logical operations at each TDL, with each bitwise logical operation including negating the incoming bit value (e.g., output in response to the applied second reference drive voltage R4) and then performing an OR operation of the negated incoming bit value with the bit value currently stored in the TDL (e.g., output from the applied first reference drive voltage R2). The logical operation process will be explained further in FIG. 4B. The output of the bitwise logical operations is stored in the respective TDLs.

While R4 sensing process 306 is occurring at time t2, a pattern detecting process, R2 bit counting process 308, is also occurring. As previously described, the pattern detecting process is shown as a bit counting process, but may be any suitable process that detects a pattern in the values stored in the CDLs of the wordline of memory cells. In some embodiments, the R2 bit counting process 308 may include calculating a number of logical ones in the data stored in the TDLs (e.g., by sending the data stored in the TDLs to the CDLs for counting, since the TDLs may be undergoing other storing operations from the R4 sensing process 306). However, it will be understood that the R2 bit counting process 308 may include additional process or may be substituted by a different process to determine a pattern in the data stored in the TDLs. For example, the R2 bit counting process 308 may include a count of logical zeros in the data stored in the TDLs, a ratio of total logical ones to logical zeros in the TDLs, or a combination thereof. In some embodiments, the time needed to perform the R2 bit counting process 308 is lower than the time needed to perform the R4 sensing process 306 (e.g., less than the time value equal to t3 subtracted by t2), such that the R2 bit reading process 308 occurs without any overhead processing time added to the execution of the read process 300.

At time t3, the output bits for each cell from R4 sensing process 306 is completed, and a third reference drive voltage R6 is applied to the wordline of memory cells in an R6 sensing process 310. The R6 sensing process 310 is the same as that of the R4 sensing process 306, but with the third reference drive voltage applied, and, in some embodiments, with different logical bitwise operations occurring at each TDL compared to the logical bitwise operations performed in the R4 sensing process 308. In some embodiments, each bitwise logical operation in R6 sensing process 310 includes a AND operation of the incoming bit value (e.g., output in response to the applied third reference drive voltage) with the bit value currently stored in the TDL. The logical operation process will be explained further in FIG. 4B. The stored value in each TDL is then replaced with the resulting bit value of the logical bitwise operation for each TDL.

While R6 sensing process 310 is occurring, an R2+R4 bit counting process 312 is also occurring. The process in the R2+R4 bit counting process 312 is the same as the described process in the R2 bit counting process 308, but counts the bits stored in the CDLs as a result of the R4 sensing process 306. In some embodiments, the time needed to perform the R2+R4 bit counting process 312 is lower than the time needed to perform the R6 sensing process 310 (e.g., less than the time value equal to t4 subtracted by t3), such that the R2+R4 bit reading process 312 occurs without any overhead processing time added to the execution of the read process 300.

At t4, a data out process 314 completes execution of the read command in 302. During the data out process 314, the data held in memory (e.g., the TDLs) containing the output bit values of the R6 sensing process 310 is read by the control circuitry 111. It will be understood that the bit values read in data out process 314 represents the actual value of the CSB stored in the memory cell.

While the data out process 314 is occurring, an R2+R4+R6 bit counting process 316 is also occurring. The process in the R2+R4+R6 bit counting process 316 is the same as the described process in the R2+R4 bit counting process 312, but counts the bits stored in the CDLs as a result of the R6 sensing process 310. In some embodiments, the time needed to perform the R2+R4+R6 bit counting process 316 is lower than the time needed to perform the data out process 314, such that the R2+R4+R6 bit reading process 316 occurs without any overhead processing time added to the execution of the read process 300.

FIG. 3B depicts an illustrative timeline 350 of a sensing process for a second reference drive voltage as described in FIG. 3A, in accordance with some embodiments of the present disclosure. As shown, the sensing process for the second reference drive voltage is the R4 sensing process 306, which begins at time t2 (e.g., corresponding to time t2 in FIG. 3A). The R4 sensing process 306 begins at step 352, where the second reference drive voltage is applied. In some embodiments, applying the reference drive voltage to the wordline occurs within two microseconds. Immediately after, at time t2a, a bit line pre-charge process occurs at step 354, in which the applied voltage applied to the wordline of memory cells has time to travel through each respective memory cell. In some embodiments, the bit line pre-charge process occurs within 6 microseconds. Immediately after, at time t2b, sensing occurs at step 356. If a voltage is sensed (e.g., the applied reference drive voltage is higher than the voltage of the memory cell), a logical one is output, and if a voltage is not sensed at step 356 (e.g., the applied reference drive voltage is lower than the voltage of the memory cell), then a logical zero is output.

At time t2c, the sensing at step 356 is complete and a 0.5 microsecond break interval occurs at step 358. The resulting bit value of the sensing may be transferred to the SDL, where it will be amplified and then sent to the TDL to be read or stored in memory, and/or the CDL to be counted. In combination, steps 356 and 358 may occur within 1.5 microseconds in some embodiments.

While the steps 352, 354, 356, and 358 of R4 sensing process 306 are occurring, the R2 bit counting process 308 is also occurring as described in FIG. 3A. As shown, the R2 bit counting process 308 may begin slightly after t2 in some embodiments, so long as the R2 bit counting process 308 is completed before time t3.

Figure 4A:
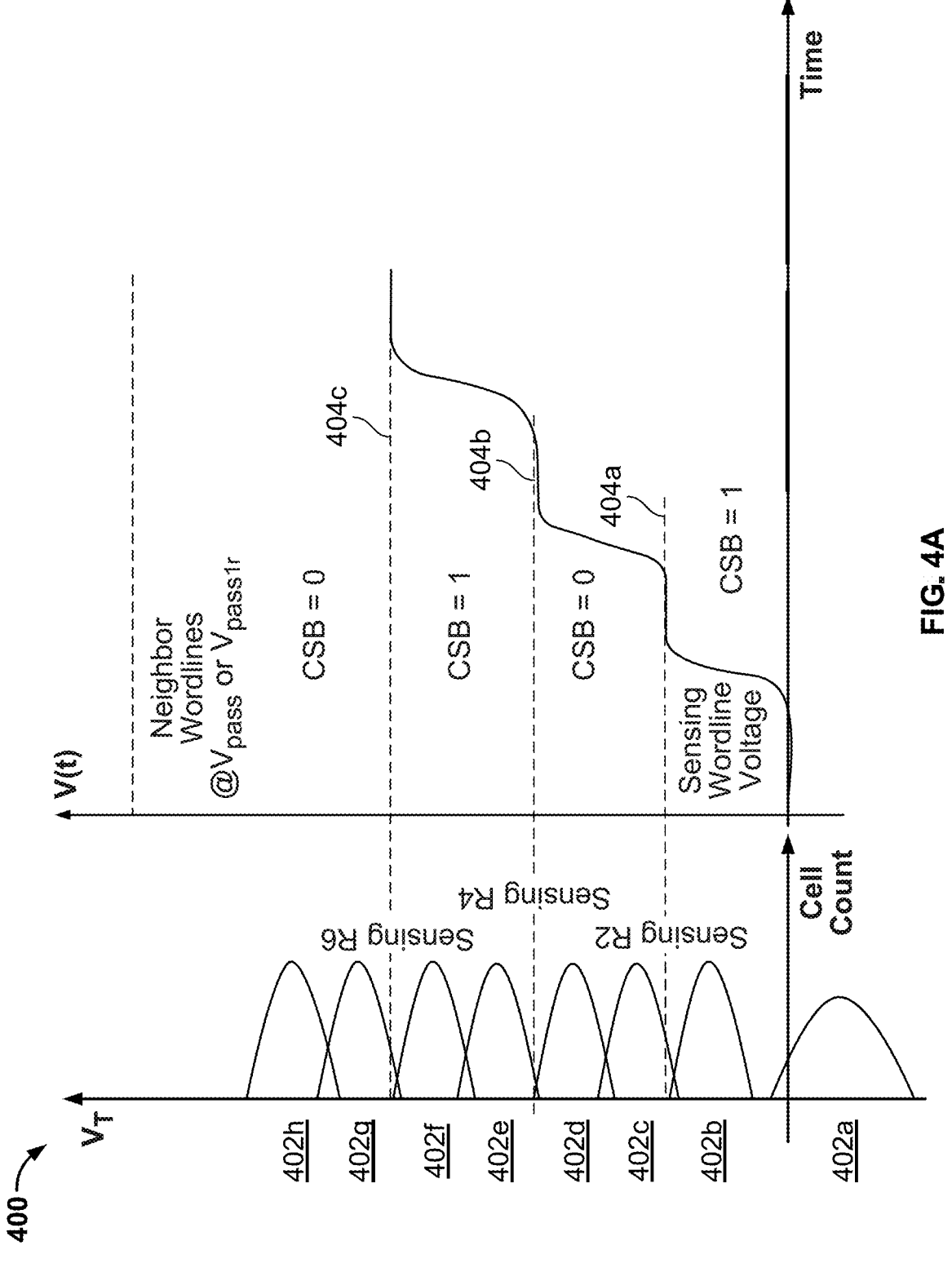

FIGS. 4A-4B depict a CSB read process 400 for a TLC flash memory cell, without a pattern detecting process, in accordance with some embodiments of the present disclosure. Similar to FIG. 3, FIGS. 4A-4B describe an example of the method and systems explained in FIGS. 1 and 2, in applications directed to reading respective CSBs of a wordline of TLC flash memory cells (e.g., each memory cell having 3 bits stored). Although FIGS. 4A-4B are described in the context of the particular structures, components, and processing of the present disclosure, it will be understood that in some embodiments, one or more of the processes described in FIGS. 4A-4B may be modified, moved, removed, or added, for different bit reads (e.g., MSB, LSB, other suitable bits, or a combination thereof) and/or different types of memory cells (e.g., storing different numbers of bits per cell).

FIG. 4A shows the drive voltages being applied to a TLC flash memory cell storing a voltage corresponding to a combination of three bits. The TLC flash memory cell has eight discrete voltage levels 402a-402h, with each discrete voltage level corresponding to a different combination of three bits stored in the TLC memory cell. For example, voltage 402a may correspond to a binary value 111, voltage 402b may correspond to binary value 110, and voltage 402h may correspond to a binary value 000. In order to determine the CSB in the CSB read process 400, three reference drive voltages may be needed (e.g., including a first reference drive voltage 404a, a second reference drive voltage 402b, and a third reference drive voltage 404c). The first reference drive voltage 404a may be at a voltage level between the voltage levels representing 110 and 101 (e.g., 402b and 402c, respectively). The second reference drive voltage 404b may be at a voltage level between the voltage levels representing 100 and 011 (e.g., 402d, 402e), and the third reference drive voltage 404c may be at a voltage level between the voltage levels representing 010 and 001 (e.g., 402f, 402g).

It will be understood that a non-ideal TLC flash memory cell does not store an exact voltage level for a combination of bits (e.g., if the binary value 110 was stored, removed, and then stored again in a TLC flash memory, the two stored voltages would not necessarily be exactly equal). Because TLC flash memory cells have small overall voltages, precision in stored voltage levels may be difficult. Therefore, voltage levels 402a-402h are shown in FIG. 4 as a distribution of probabilities, where the value of the distribution function at a specific voltage level represents the probability that the corresponding combination of bits is stored in the memory cell with the specific voltage level. As shown, the distributions for each combination of the three binary bits are each centered (e.g., the probability is highest) at the ideal discrete voltage level corresponding to the respective combination.

However, as described previously, in a non-ideal TLC flash memory cell, as read/write operations are performed over time, the stored voltage level of one or more combinations may shift. For example, if the stored voltage level 402b increases over time, then if the first reference drive voltage 404a is not changed, an increase in the number of erroneous readings may occur (e.g., the CSB read process 400 may more often incorrectly read a 1 bit as a 0 bit, particularly for the 110 binary value in this example).

FIG. 4B depicts an illustrative chart 450 of the bit values output at each step of the CSB read process 400, in accordance with some embodiments of the present disclosure. In some embodiments, the output bit values described in FIG. 4B correspond to the output bit values of the logical bitwise operations described in FIG. 3A (e.g., in at least the R4 sensing process and the R6 sensing process). Column 452 shows eight possible combinations of three particular binary bits. As previously described, each combination is represented in a TLC flash memory cell as a discrete voltage level. For each combination enumerated in column 452, the respective value in column 454 shows a resulting bit value after applying the first reference drive voltage R2 (e.g., 404a) to the TLC flash memory cell. If the TLC flash memory cell is storing a voltage level below the first reference drive voltage, a logical one is returned, and if the TLC flash memory cell is storing a voltage level above the first reference drive voltage, a logical zero is returned. It will be understood that the output of column 454 is the output value of an R2 sensing process (e.g., that is sent to the SDL), stored in the memory (e.g., the TDL), and counted in the CDL (e.g., in an R2 bit counting process).

For each combination enumerated in column 452, the respective value in column 456 shows a resulting bit value after applying the second reference drive voltage R4 (e.g., 404b) to the TLC flash memory cell. If the TLC flash memory cell is storing a voltage level below the second reference drive voltage, a logical one is returned, and if the TLC flash memory cell is storing a voltage level above the second reference drive voltage, a logical zero is returned.

The result in column 456 is then negated, and a logical OR operation is performed between the negated value from column 456 and the corresponding bit value from column 454 (e.g., that is stored in the TDL) to get the resulting bit value shown in column 458. It will be understood that the output of column 458 is the output value of an R4 sensing process (e.g., that is sent to the SDL), stored in the memory (e.g., the TDL), and counted in the CDL (e.g., in an R2+R4 bit counting process).

For each combination enumerated in column 452, the respective value in column 460 shows a resulting bit value after applying the second reference drive voltage R6 (e.g., 404c) to the TLC flash memory cell. If the TLC flash memory cell is storing a voltage level below the third reference drive voltage, a logical one is returned, and if the TLC flash memory cell is storing a voltage level above the third reference drive voltage, a logical zero is returned.

A logical AND operation is performed between the resulting value from column 460 and the corresponding bit value from column 458 (e.g., that is stored in the TDL) to get the resulting bit value shown in column 462. It will be understood that the output of column 462 is the output value of an R6 sensing process (e.g., that is sent to the SDL), stored in the memory (e.g., the TDL), and counted in the CDL (e.g., in an R2+R4+R6 bit counting process). As shown, the resulting bit value shown in column 462 corresponds exactly to the CSB value of the respective combination of bits in column 452.

Figure 5:
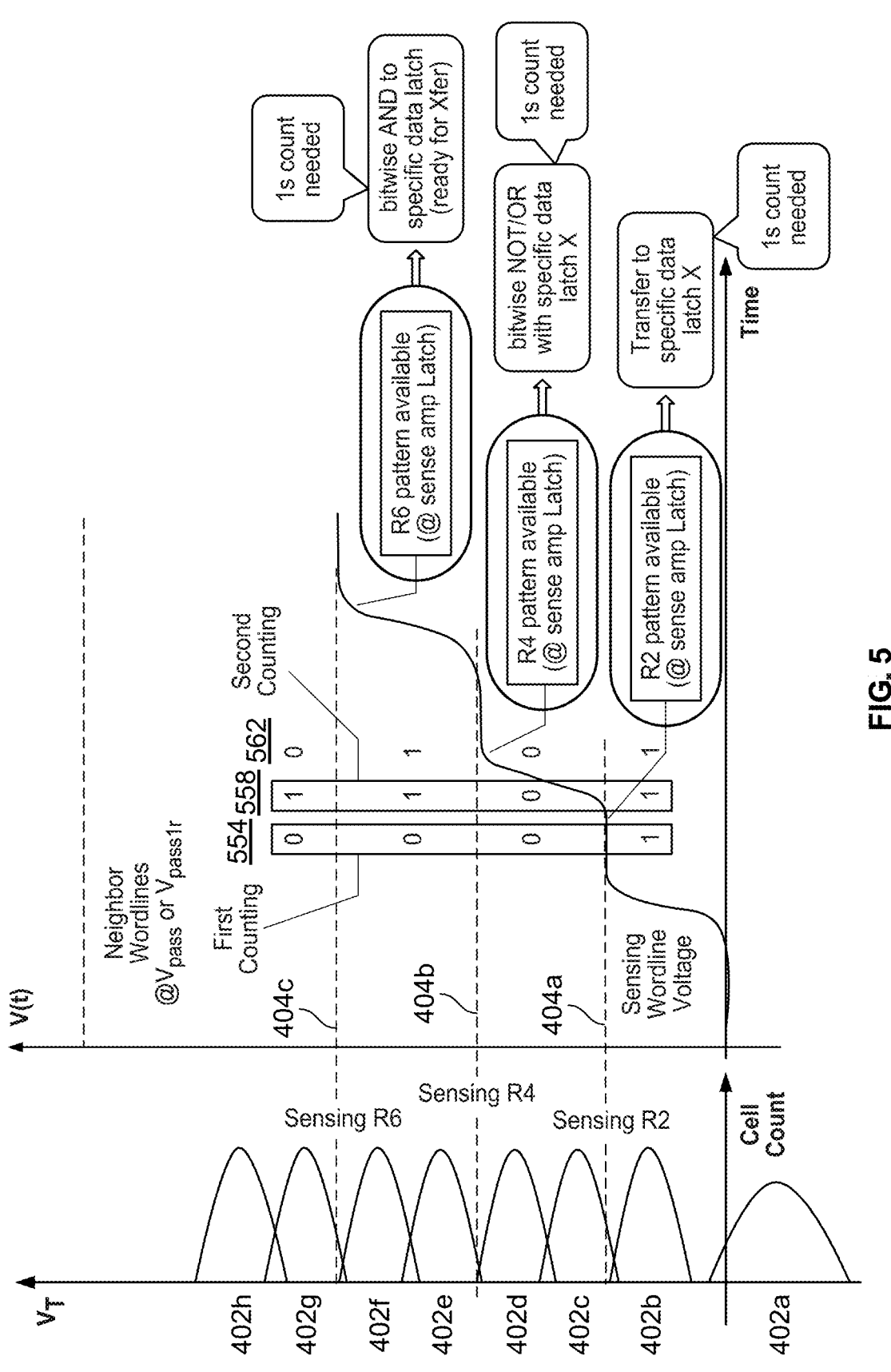
FIG. 5 depicts a CSB read process for a TLC flash memory cell, with a pattern detecting process, in accordance with some embodiments of the present disclosure.

FIG. 5 depicts a CSB read process 500 for a TLC flash memory cell, with a pattern detecting process, in accordance with some embodiments of the present disclosure. Similar to FIG. 3, FIG. 5 describes an example of the method and systems explained in FIGS. 1 and 2, in applications directed to reading respective CSBs of a wordline of TLC flash memory cells (e.g., each memory cell having 3 bits stored), and in some embodiments for different bit reads (e.g., MSB, LSB, other suitable bits, or a combination thereof) and/or different types of memory cells (e.g., storing different numbers of bits per cell), one or more of the processes described in FIG. 5 may be modified, moved, removed, or added.

Similar to FIG. 4A, FIG. 5 includes the eight discrete voltage levels 402a-402h that correspond to the probability distributions of the voltage stored in the TLC flash memory cell for a particular combination of three binary bits. FIG. 5 also includes the three reference drive voltages 404a-404c (e.g., R2, R4, and R6, respectively).

As a result of performing an R2 sensing process, an R4 sensing process, and an R6 sensing process, a first result 554, a second result 556, and a third result 562, respectively, is returned. The first result 554 corresponds to the result values in column 454 in FIG. 4B, the second result 558 corresponds to the result values in column 458, and the third result 562 corresponds to the result values in column 462. In a CSB read process without pattern detection, such as the CSB read process 400, only the third result 562 is output in a latch read (e.g., in the data out process 314 in FIG. 3A), where the third result 562 is the CSB value. However, in CSB read process 500 that utilizes a pattern detecting process, a pattern detection process is performed on the intermediate results 554 and 558. As shown, the pattern detection process is a bit count of the logical ones in the wordline of memory cells. In some embodiments, the pattern detection process may be a bit count of logical ones, a bit count of logical zeroes, a ratio of logical ones to logical zeros, other suitable pattern detection processes, or a combination thereof. In some embodiments, a series of CDLs for each cell in the wordline of memory cells may be utilized as described in FIG. 2 to perform the bit counting, where the bit value in the corresponding TDL (e.g., memory) is transferred to the CDL for bit counting while the bit value in the TDL is overwritten or read (e.g., as a next step in the CSB read process is being performed).

When an erroneous read operation occurs (e.g., and is detected by, for instance, a CRC process), the memory device may determine which reference drive voltage may need to be adjusted based on the detected patterns. For example, if the R2 sensing process is expected to return approximately 50% logical ones and 50% logical zeroes (e.g., a random distribution), and pattern analysis determines only 25% of output bits from the R2 sensing process are logical ones (e.g., the stored voltage in the memory cell is lower than the R2 voltage), then the R2 voltage may be determined to be in error, and shifted higher by a predetermined amount. In some embodiments, the predetermined amount may be a fixed value. In some embodiments, the predetermined amount may be variable, based on the returned result of the sensing process. In future reads, this new R2 voltage will be used in place of the previous R2 voltage, until another erroneous read occurs and the reference drive voltages may need to be shifted again.

Figure 6B:
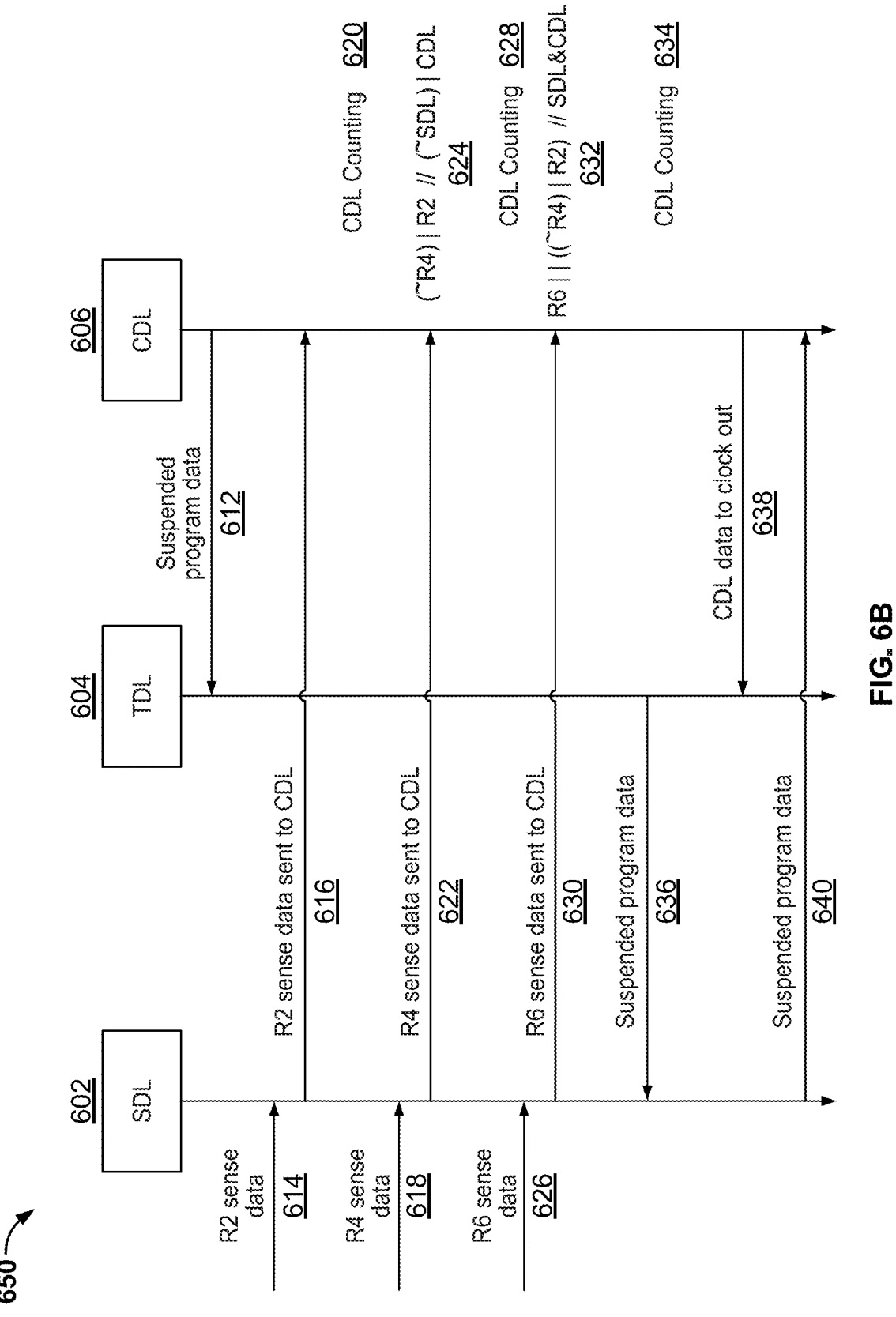

FIGS. 6A-6B show illustrative flowcharts 600 and 650, respectively, of a read process with a pattern detection process occurring during a program suspend, in accordance with some embodiments of the present disclosure. The described process in FIGS. 6A-6B is directed to a CSB read process for a wordline of TLC flash memory cells. For example, the wordline of memory cells may correspond to the wordline of memory cells 115 in FIG. 1, with memory cells 116$_1$-116$_n$ and correspondingly coupled latches 118$_1$-118$_n$. Moreover, in some embodiments each latch of latches 118$_1$-118$_n$ may include a respective SDL (e.g., SDL 120), TDL (e.g., TDL 122), and CDL (e.g., CDL 124). A program suspend may occur, for example, when a read operation is requested (e.g., from a host device 102) when an internal garbage collection or other suitable operation utilizing a memory (e.g., the TDL or CDL) of a memory device (e.g., memory device 105 in FIG. 1) is stopped. In some embodiments, when the program suspend occurs, data corresponding to the suspended program in the latches cannot be read out, and must stay in the latch memory (e.g., to prevent being lost). Therefore, in order to perform, for example, a CSB read for a wordline of memory cells (e.g., such that the memory cells include at least TLC flash memory cells), the suspended data may be moved around the latches while sensing and pattern detecting processes occur.

As described in FIG. 2, a latch (e.g., such as latches 118$_1$, 118$_2$, . . . , 118$_n$) may include an SDL, TDL, and a CDL. In the illustrative flowcharts 600 and 650, SDL 602 may represent all of the SDLs in a wordline of memory cells (e.g., SDLs 120$_1$, 120$_2$, . . . , 120$_n$), TDL 604 may represent all of the TDLs in a wordline of memory cells, and CDL 606 may represent all of the CDLs in a wordline of memory cells. CDL 606 may currently hold the suspended program data, and the read process illustrated by flowcharts 600 and 650 may begin at step 612, where the suspended program data is transferred to the TDL (e.g., a temporary memory).

At step 614, an R2 sensing process is executed (e.g., the R2 sensing process 304 as described in FIG. 3), and the output bit values are sent to the respective SDLs in SDL 602. As described in FIG. 2, at the SDL 602 the received voltage (e.g., corresponding to the output bit values) are amplified such that there is a larger voltage difference between a logical one and a logical zero (e.g., it is easier to differentiate between a logical one and a logical zero). The amplified R2 sense data is then sent to the CDL at step 616. It will be understood that in a normal read process (e.g., with no program suspend), the amplified sense data may be sent to TDL 604 in some embodiments. However, because current the TDL 604 is holding the suspended program data, TDL 604 may not have the space to hold the R2 sense data in memory.

At step 618, execution of an R4 sensing process begins (e.g., as described in step 306 in FIG. 3A). While R4 sensing occurs, and the output voltages are sent to the now-empty SDL 602, at CDL 606 a pattern detection process occurs at step 620 with the currently stored data in CDL 606. In some embodiments, the pattern detecting process may be a bit count of logical ones. Once the R4 sensing process is complete and the respective voltages have all been amplified in the SDL 602, the R4 sense data is sent to the CDL in step 622. It will be understood that, if no overhead time is incurred due to the additional bit counting process in step 620, then execution of step 620 may be completed before the R4 sense data is sent to the CDL in step 622.

Once the R4 sense data is sent to the CDL 606 in step 622, the R4 sense data may be compared to the respective R2 sense data in a bitwise logical operation. In some embodiments, the logical bitwise operation may be a negation of the R4 sense data (i.e., ~SDL), and then performing an OR operation with the respective R2 sense data currently in CDL 606 (i.e., (~SDL)|CDL).

At step 626, execution of an R6 sensing process begins (e.g., as described in step 310 in FIG. 3A). While R6 sensing occurs, and the output voltages are sent to the now-empty SDL 602, at CDL 606 a pattern detection process occurs at step 628 with the currently stored data in CDL 606. In some embodiments, the pattern detecting process at step 628 may be a bit count of logical ones. Once the R6 sensing process is complete and the respective voltages have all been amplified in the SDL 602, the R6 sense data is sent to the CDL in step 630. It will be understood that, if no overhead time is incurred due to the additional bit counting process in step 628, then execution of step 628 may be completed before the R6 sense data is sent to the CDL in step 630.

Once the R6 sense data is sent to CDL 606 in step 632, the R6 sense data may be compared to the respective sense data currently in CDL 606 (e.g., (~R4)|R2) using a bitwise logical operation. In some embodiments, the bitwise logical operation may be an AND operation between the R6 sense data (e.g., from SDL 602) and the data currently in CDL 606 (e.g., where the bitwise logical operation may be notated as R6||((~R4)||R2), or SDL&CDL).

At step 634, a pattern detecting process may be performed on the result data from step 632 in CDL 606. In some embodiments, the pattern detecting process may be a bit count of logical ones. While execution of step 634 is performed, the suspended program data may be transferred to the SDL 602. It will be understood that the output data of the read process (e.g., the requested data) is represented by the result of step 632, and in order to read out the data (e.g., the data out process 314 in FIG. 3A), the data from step 632 needs to be in the TDL 604. Therefore, the suspended program data is moved to the SDL 602 to vacate memory space in the TDL 604 (e.g., where the suspended program data cannot be moved immediately to CDL 606 because CDL 606 is storing the data from step 632). The data from step 632 in CDL 606 is then transferred to TDL 604, where the data is output in response to the requested read process. The suspended program data is then finally returned to the CDL 606 at step 640.

FIG. 7 shows an illustrative flowchart 700 of steps for dynamically modifying one or more read reference drive voltages based on detected pattern data, in accordance with some embodiments of the present disclosure. Although the steps of flowchart 700 are described as being performed by the control circuitry 111 in FIG. 1, the steps of flowchart 700 may also be performed, for example, by an external controller (e.g., coupled to memory device 105), an additional controller onboard the memory device, other suitable controllers and/or processors, or a combination thereof. Although FIG. 7 is described in the context of the particular structures, components, and processing of the present disclosure, and although a particular order and flow of steps are depicted in FIG. 7, it will be understood that in some embodiments, one or more of the steps may be modified, moved, removed, or added, and that the order of steps depicted in FIG. 7 may be modified.

As described previously, the first reference drive voltage and second reference drive voltage as described herein are relative, and are not limited to specifically refer to only the first actual reference voltage and second actual reference voltage applied to a wordline of memory cells. For example, in a memory cell that stores seven bits, the first reference drive voltage and second reference drive voltage as described herein may refer to a second actual reference voltage and a third actual reference voltage, respectively, a third actual reference voltage and a fourth actual reference voltage, respectively, a sixth reference voltage and a seventh actual reference voltage respectively, or any nth actual reference voltage and (n+1)th actual reference voltage, respectively. In some embodiments that include multiple iterations or pairs of reference drive voltages, the relative first reference drive voltage and second reference drive voltage described herein may refer to different actual reference voltages at each iteration or pairing. For example, in a memory cell that stores seven bits, the method described herein utilizing a first reference drive voltage and a second reference drive voltage may first be applied to a first actual reference drive voltage and a second actual reference drive voltage, respectively, and then be applied to a second actual reference drive voltage and a third actual reference drive voltage, respectively, any suitable nth actual reference drive voltage and (n+1)th actual reference drive voltage, or a combination thereof. Similarly, the third reference drive voltage as described herein is also relative, and if the first reference drive voltage represents a nth actual reference drive voltage, then the third reference drive voltage may represent a (n+2)th actual reference drive voltage. For example, if the first reference drive voltage represents a fifth actual reference voltage, then the third reference drive voltage represents a seventh actual reference voltage. Therefore, while the following may be described in the context of a CSB read of a wordline of TLC flash memory cells, it will be understood that, particularly when the present disclosure is applied to memory cells that store more than three bits, that the first reference drive voltage, second reference drive voltage, and third reference drive voltage may refer to any nth actual reference drive voltage, (n+1)th actual reference drive voltage, and (n+2)th actual reference drive voltage, respectively.

Processing begins at step 702, where the control circuitry (e.g., control circuitry 111 of FIG. 1) applies a first reference drive voltage to each memory cell in a wordline of memory cells. In some embodiments, the first reference drive voltage may be R2 (e.g., as described in step 304 in FIG. 3), and the wordline of memory cells may be the wordline 115 in FIG. 1. Each memory cell (e.g., cells $116_1$, $116_2$, . . . , $116_n$) generates a respective first resulting voltage level in response to the applied first reference drive voltage. Processing may then continue to step 704.

At step 704, the control circuitry (e.g., control circuitry 111 of FIG. 1) stores in a memory a first respective logic value indicated by each respective first resulting voltage level. In some embodiments, each first resulting voltage level may be one of two discrete possible voltage levels (e.g., the first resulting voltage level corresponds to a binary bit). For example, if the first resulting voltage level is equal to a first possible voltage level, the respective logic value may be a logical one. If the first resulting voltage level is equal to a second possible voltage level, the respective logic value may be a logical zero. In some embodiments, a possible voltage level may be equal to zero. In some embodiments, each cell may be attached to one or more latches (e.g., latches $118_1$-$118_n$), where each latch may contain a memory (e.g., a TDL) to store an output binary bit value from the applied first reference drive voltage. Processing may then continue to step 706.

At step 706, the control circuitry (e.g., control circuitry 111 of FIG. 1) applies a second reference drive voltage to each memory cell in a wordline of memory cells. In some embodiments, the second reference drive voltage may be R4 (e.g., as described in step 306 of FIG. 3). Each memory cell (e.g., cells $116_1$-$116_n$) generates a respective second resulting voltage level in response to the applied second reference drive voltage. Processing may then continue to step 708.

At step 708, the control circuitry (e.g., control circuitry 111 of FIG. 1) detects a pattern of the logic values stored in the memory. As shown, step 708 may be executed in parallel with the elements of step 706. However, it will be understood that in some embodiments step 708 may be executed after step 706 (e.g., in series). In some embodiments, the detected pattern is provided by the control circuitry to a coupled external controller, and the external controller may execute further steps relating to the detected pattern. In some embodiments, the pattern may be bit count of a total number of logical ones stored in the memory (e.g., the TDLs in the wordline of memory cells). In some embodiments, the pattern may be a bit count of logical zeroes, a ratio of total logical ones to total logical zeroes, other suitable patterns, or a combination thereof. In some embodiments, the pattern detecting may occur while the second reference drive voltage is being applied to the wordline of memory cells and the respective second resulting voltage levels are being generated. Processing may then continue to step 710.

At step 710, the control circuitry (e.g., control circuitry 111 of FIG. 1) may modify the memory based on a respective second logic value indicated by each respective second resulting voltage level. Similar to step 704, in some embodiments each second voltage level may correspond to a binary bit (e.g., either a logical zero or a logical one, depending on the respective voltage level). In some embodiments, each respective second logic value may be compared to the respective first logic value (e.g., that is stored in the memory) by a bitwise logical operation. For example, each respective second logic value may be negated, and a respective resulting negated second logic value may be compared with an OR operation to the respective first logic value. A resulting bit value may therefore be stored in the memory in place of the respective first logic value. Processing may then continue to step 712.

At step 712, the control circuitry (e.g., the control circuitry 111 of FIG. 1, or an external controller, as previously described) modifies at least one of the first reference drive voltage and the second reference drive voltage based on the detected pattern data. In some embodiments, the first reference drive voltage may be modified directly based on the detected pattern data. In some embodiments, the detected pattern data may be a bit count of total logical ones, and based on an expected distribution, the resulting number of logical ones may indicate if and how the first reference drive voltage should be modified. For example, if the expected distribution is 50% logical ones and 50% logical zeroes (e.g., the value of the binary bit is random), then if the detected pattern is, for example, 80% logical ones (e.g., a stored voltage level of the memory cell is lower than the first reference drive voltage) and 20% logical zeroes (e.g., the stored voltage level of the memory cell is higher than the first reference drive voltage), then the first reference drive voltage may be modified to decrease by a predetermined amount. In some embodiments, the predetermined amount may be a fixed value. In some embodiments, the predetermined amount may be variable, based on the returned result of the sensing process. In some embodiments, modifying the second drive voltage may be based on the current modified values stored in the memory (e.g., based on the first and second resulting voltage levels).

It will be understood that in some embodiments utilizing more than two references voltages, the steps of FIG. 7 may be repeated. Because the first reference drive voltage and second reference drive voltage are relative, the steps of FIG. 7 may be iterated for any nth actual reference voltage and (n+1)th actual reference voltage, respectively. For example, in a second iteration of the steps of FIG. 7 the first reference drive voltage may refer to a second actual reference voltage, and the second reference drive voltage may refer to a third actual reference voltage. In some embodiments, the steps of FIG. 7 may be iteratively repeated until all actual reference voltages have been modified.

Figure 8:
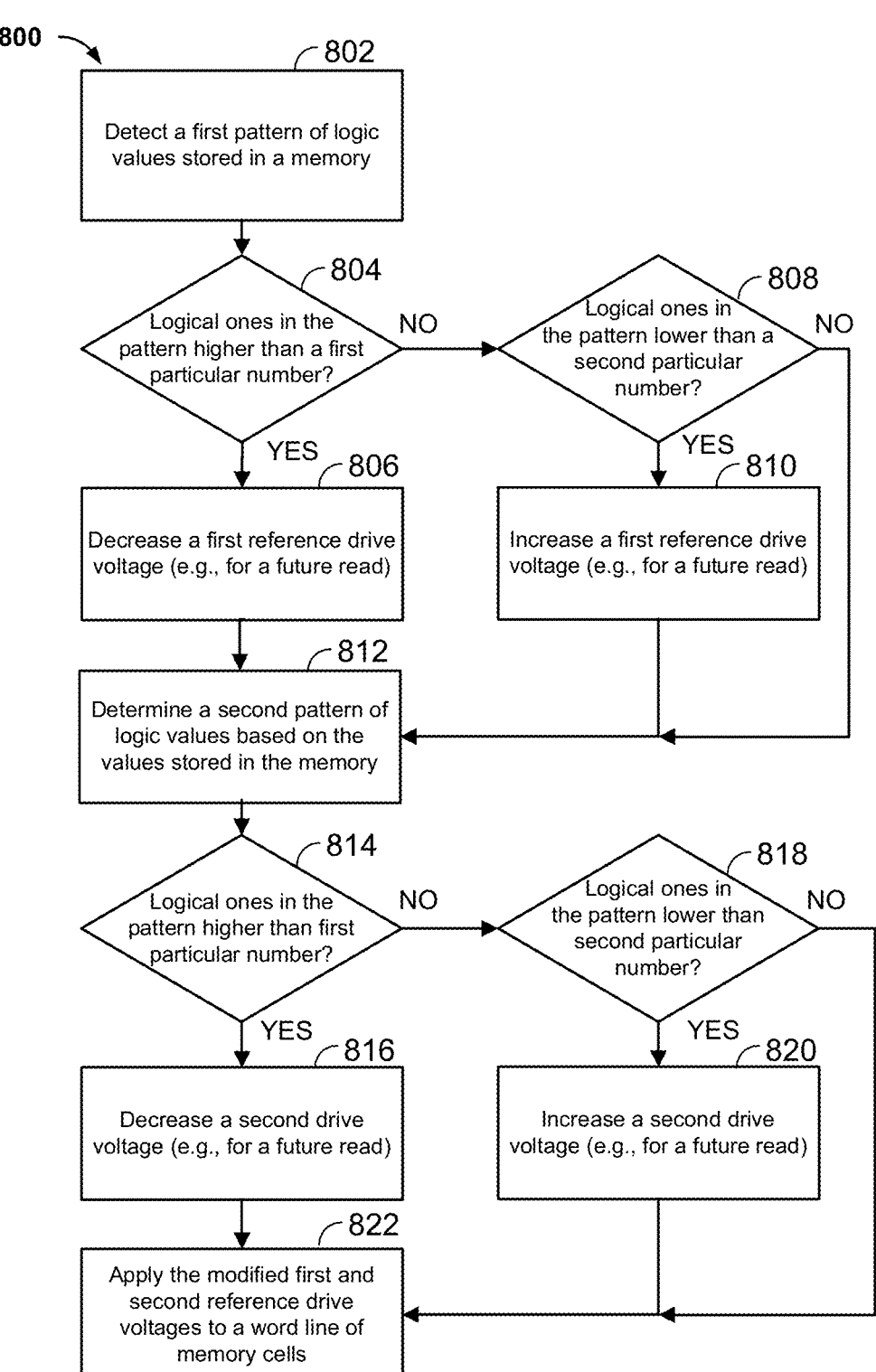
FIG. 8 shows a flowchart of steps to modify at least one of a first drive voltage or a second drive voltage, in accordance with an embodiment of the present disclosure.

FIG. 8 shows a flowchart 800 of steps to modify at least one of a first drive voltage or a second drive voltage, in accordance with an embodiment of the present disclosure. Although the steps of flowchart 800 are described as being performed by the control circuitry 111 in FIG. 1, the steps of flowchart 800 may also be performed, for example, by an external controller (e.g., coupled to memory device 105), an additional controller onboard the memory device, other suitable controllers and/or processors, or a combination thereof. Although FIG. 8 is described in the context of the particular structures, components, and processing of the present disclosure, and although a particular order and flow of steps are depicted in FIG. 8, it will be understood that in some embodiments, one or more of the steps may be modified, moved, removed, or added, and that the order of steps depicted in FIG. 8 may be modified. For example, it will be understood that not all of the steps of FIG. 8 may be performed every time pattern analysis occurs, and that in some embodiments, the steps of FIG. 8 may only be executed when a read error occurs (e.g., and is detected by, for instance, a CRC process).

As described previously, the first reference drive voltage and second reference drive voltage as described herein are relative, and are not limited to specifically refer to only the first actual reference voltage and second actual reference voltage applied to a wordline of memory cells. For example, in a memory cell that stores seven bits, the first reference drive voltage and second reference drive voltage as described herein may refer to a second actual reference voltage and a third actual reference voltage, respectively, a third actual reference voltage and a fourth actual reference voltage, respectively, a sixth reference voltage and a seventh actual reference voltage respectively, or any nth actual reference voltage and (n+1)th actual reference voltage, respectively. In some embodiments that include multiple iterations or pairs of reference drive voltages, the relative first reference drive voltage and second reference drive voltage described herein may refer to different actual reference voltages at each iteration or pairing. For example, in a memory cell that stores seven bits, the method described herein utilizing a first reference drive voltage and a second reference drive voltage may first be applied to a first actual reference drive voltage and a second actual reference drive voltage, respectively, and then be applied to a second actual reference drive voltage and a third actual reference drive voltage, respectively, any suitable nth actual reference drive voltage and (n+1)th actual reference drive voltage, or a combination thereof. Similarly, the third reference drive voltage as described herein is also relative, and if the first reference drive voltage represents a nth actual reference drive voltage, then the third reference drive voltage may represent a (n+2)th actual reference drive voltage. For example, if the first reference drive voltage represents a fifth actual reference voltage, then the third reference drive voltage represents a seventh actual reference voltage. Therefore, while the following may be described in the context of a CSB read of a wordline of TLC flash memory cells, it will be understood that, particularly when the present disclosure is applied to memory cells that store more than three bits, that the first reference drive voltage, second reference drive voltage, and third reference drive voltage may refer to any nth actual reference drive voltage, (n+1)th actual reference drive voltage, and (n+2)th actual reference drive voltage, respectively.

At step 802, the control circuitry (e.g., control circuitry 111 of FIG. 1) detects a first pattern of logic values stored in a memory. In some embodiments, step 802 may correspond to step 706 in FIG. 7, such that steps 702 and 704 have already been performed (e.g., a first reference voltage is applied to a wordline of memory cells, and for each memory cell, a respective first output bit value is stored in the memory). In some embodiments, the pattern detected may be a bit count of logical ones (e.g., across the wordline of memory cells), a bit count of logical zeroes, a ratio of logical ones to logical zeroes, other suitable patterns, or a combination thereof. In the described embodiment, for example, it will be understood that the pattern detected is a bit count of logical ones. Processing may then continue to step 804.

At step 804, the control circuitry (e.g., control circuitry 111, or in some embodiments, an external controller) determines if the logical ones in the detected pattern are higher than a first particular number. In some embodiments, the first particular number may be based on the total number of memory cells in the wordline, an expected distribution of logical ones and logical zeroes, or a combination thereof. As an illustrative example, for a wordline of 18000 memory cells and an expected distribution of 50% logical ones, the first particular number may be set at approximately 10000

(e.g., slightly over 50%, to account for variance without overcorrecting the reference drive voltages). If the number of logical ones is higher than the first particular number (e.g., "YES" to step 804), processing may continue to step 806. If the number of logical ones is not higher than the first particular number (e.g., "NO" to step 804), processing may continue to step 808.

At step 806, the control circuitry (e.g., control circuitry 111 of FIG. 1) decreases a first reference drive voltage. In some embodiments, the decrease may be based on how high the bit count of logical ones is compared to the first particular number. For example, the higher the bit count of logical ones is (i.e., the further away the bit count of logical ones is compared to the first particular number), the further away the first reference drive voltage is from an optimal first reference drive voltage. Therefore, if the first particular number for a wordline of 18000 memory cells is, for example, 10000 logical ones, and the bit count results in 15000 logical ones, a larger decrease in the first reference drive voltage may occur compared to, for instance, a bit count result of 11000 logical ones. Processing may then continue to step 812.

At step 808, the control circuitry (e.g., control circuitry 111, or in some embodiments, an external controller) determines if the logical ones in the detected pattern is lower than a second particular number. In some embodiments, the second particular number may be based on the total number of memory cells in the wordline, an expected distribution of logical ones and logical zeroes, or a combination thereof. As an illustrative example, for a wordline of 18000 memory cells and an expected distribution of 50% logical ones, the second particular number may be set at approximately 8000 (e.g., slightly under 50%, to account for variance without overcorrecting the reference drive voltages). If the number of logical ones is less than the second particular number (e.g., "YES" to step 808), processing may continue to step 810. If the number of logical ones is not lower than the second particular number (e.g., "NO" to step 808), processing may continue to step 812.

At step 810, the control circuitry (e.g., control circuitry 111 of FIG. 1) increases a first reference drive voltage. In some embodiments, the increase may be based on how low the bit count of logical ones is compared to the second particular number. For example, the lower the bit count of logical ones is (i.e., the further away the bit count of logical ones is compared to the second particular number), the further away the first reference drive voltage is from an optimal first reference drive voltage. Therefore, if the second particular number for a wordline of 18000 memory cells is, for example, 8000 logical ones, and the bit count results in 3000 logical ones, a larger increase in the first reference drive voltage may occur compared to, for instance, a bit count result of 6000 logical ones. Processing may then continue to step 812.

At step 812, the control circuitry (e.g., control circuitry 111 of FIG. 1) determines a second pattern of logic values based on the values stored in the memory. In some embodiments, step 812 may occur if the wordline of memory cells is a wordline of TLC flash memory cells (or has more than three levels, such as a quad level cell (QLC)), and if a read process utilizes more than one reference drive voltage (e.g., a CSB read). It will be understood that, while steps 804 to 810 are performed, a second reference drive voltage is applied to the wordline of memory cells, and the values stored in the memory are new values based on the output bit values for the applied second reference drive voltage (e.g., a bitwise logical operation between the respective bit values output by the second reference drive voltage and the respective bit values output by the first reference drive voltage). In some embodiments, the second pattern of logic values may be a bit count of logical ones (e.g., counting the bits of the new values stored in the memory), a bit count of logical zeroes, a ratio of logical ones to logical zeroes, other suitable patterns, or a combination thereof. Processing may then continue to step 814.

At step 814, the control circuitry (e.g., control circuitry 111, or in some embodiments, an external controller) determines if the logical ones in the second detected pattern is higher than the first particular number. In some embodiments, the first particular number may be the first particular number determined in step 804. If the number of logical ones is higher than the first particular number (e.g., "YES" to step 814), processing may continue to step 816. If the number of logical ones is not higher than the first particular number (e.g., "NO" to step 814), processing may continue to step 818.

At step 816, the control circuitry (e.g., control circuitry 111 of FIG. 1) decreases a second reference drive voltage. In some embodiments, the decrease may be based on how high the bit count of logical ones is compared to the first particular number. For example, the higher the bit count of logical ones is (i.e., the further away the bit count of logical ones is compared to the first particular number), the further away the second reference drive voltage is from an optimal second reference drive voltage. Therefore, if the first particular number for a wordline of 18000 memory cells is, for example, 10000 logical ones, and the bit count results in 15000 logical ones, a larger decrease in the second reference drive voltage may occur compared to, for instance, a bit count result of 11000 logical ones. Processing may then continue to step 822.

At step 818, the control circuitry (e.g., control circuitry 111, or in some embodiments, an external controller) determines if the logical ones in the detected pattern is lower than a second particular number. In some embodiments, the second particular number may be the second particular number determined in step 808. If the number of logical ones is less than the second particular number (e.g., "YES" to step 818), processing may continue to step 820. If the number of logical ones is not lower than the second particular number (e.g., "NO" to step 818), processing may continue to step 822.

At step 820, the control circuitry (e.g., control circuitry 111 of FIG. 1) increases a second reference drive voltage. In some embodiments, the increase may be based on how low the bit count of logical ones is compared to the second particular number. For example, the lower the bit count of logical ones is (i.e., the further away the bit count of logical ones is compared to the second particular number), the further away the second reference drive voltage is from an optimal second reference drive voltage. Therefore, if the second particular number for a wordline of 18000 memory cells is, for example, 8000 logical ones, and the bit count results in 3000 logical ones, a larger increase in the second reference drive voltage may occur compared to, for instance, a bit count result of 6000 logical ones. Processing may then continue to step 822.

At step 822, the control circuitry (e.g., control circuitry 111 of FIG. 1) applies the modified (or, if "NO" was determined for either step 808, step 818, or both) first and second reference drive voltages to a wordline of memory cells. In some embodiments, the application of the modified reference drive voltages occur in a future read operation (e.g., where the process may loop back to 802 as the next output bit values from the wordline are counted). In some embodiments with more than two reference drive voltages (e.g., a CSB read), additional steps may be included in flowchart 800 to determine if the additional reference drive voltages should be increased, decreased, or not changed, and to apply the modified additional reference drive voltages in the future read.

It will be understood that in some embodiments utilizing more than two references voltages, the steps of FIG. 8 may be repeated. Because the first reference drive voltage and second reference drive voltage are relative, the steps of FIG. 8 may be iterated for any nth actual reference voltage and (n+1)th actual reference voltage, respectively. For example, in a second iteration of the steps of FIG. 8 the first reference drive voltage may refer to a second actual reference voltage, and the second reference drive voltage may refer to a third actual reference voltage. In some embodiments, the steps of FIG. 8 may be iteratively repeated until all actual reference voltages have been modified.

The foregoing is merely illustrative of the principles of this disclosure, and various modifications may be made by those skilled in the art without departing from the scope of this disclosure. The above-described embodiments are presented for purposes of illustration and not of limitation. The present disclosure also can take many forms other than those explicitly described herein. Accordingly, it is emphasized that this disclosure is not limited to the explicitly disclosed methods, systems, and apparatuses, but is intended to include variations to and modifications thereof, which are within the spirit of the following paragraphs.

While some portions of this disclosure may refer to examples, any such reference is merely to provide context to the instant disclosure and does not form any admission as to what constitutes the state of the art.

What is claimed is:

1. A method to allow for reading data from memory, the method comprising:

applying a first reference drive voltage to a wordline of memory cells to generate a respective first resulting voltage level from each respective cell in the wordline;

for each respective first resulting voltage level output by each cell in the wordline, storing in memory a first respective logic value indicated by the respective first resulting voltage level;

applying a second reference drive voltage to the wordline of memory cells to generate a respective second resulting voltage level from each respective cell in the wordline;

detecting a pattern of logic values stored in the memory;

for each respective second resulting voltage level output by each cell in the wordline, modifying the memory based on a second respective logic value indicated by the respective second resulting voltage level, wherein modifying the memory based on the second respective logic value comprises:

storing results of bitwise logical operations between the second respective logic value and a corresponding logic value of the stored first logic values, wherein the bitwise logical operations between the second respective logic value and the corresponding logic value comprise negating the respective second logic value and performing a bitwise logical operation between the negated second logic value and the corresponding logic value; and modifying at least one of the first reference drive voltage and the second reference drive voltage based on the detected pattern data.

2. The method of claim 1, wherein the detecting the pattern of logic values occurs in parallel with the applying the second reference drive voltage to the wordline of memory cells.

3. The method of claim 1, the method further comprising:

applying the modified first reference drive voltage and second reference drive voltage to the wordline of memory cells in future read operations.

4. The method of claim 1, wherein detecting the pattern of logic values comprises:

detecting the pattern of logic values while applying the second reference drive voltage to the wordline of memory cells and before modifying the memory based on the second logic values.

5. The method of claim 1, wherein detecting the pattern of logic values stored in the memory comprises calculating a number of logical ones stored in the memory.

6. The method of claim 5, wherein modifying at least one of the first reference drive voltage and the second reference drive voltage based on the detected pattern data comprises decreasing the first drive voltage in response to determining that the number of logical ones in the pattern of logic values is higher than a first particular number.

7. The method of claim 5, wherein modifying at least one of the first reference drive voltage and the second reference drive voltage based on the detected pattern data comprises increasing the first drive voltage in response to determining that the number of logical ones in the pattern of logic values is lower than a second particular number.

8. The method of claim 1, wherein detecting the pattern of logic values stored in the memory comprises calculating a number of logical zeroes stored in the memory.

9. The method of claim 1, wherein detecting the pattern of logic values stored in the memory comprises calculating a ratio of logical ones and logical zeroes stored in the memory.

10. The method of claim 1, wherein the memory comprises an array of latches, and wherein each latch of the array of latches stores a logic value.

11. The method of claim 1, wherein the memory cells comprise multi-level flash memory cells that comprise at least two reference bits, and at most seven reference bits, the method further comprising:

reading at least one bit of each of the memory cells using more than one reference drive voltages.

12. The method of claim 1, wherein the pattern of logical values is a first pattern, the method further comprising:

detecting a second pattern of logical values based on the second logic values stored in the memory.

13. The method of claim 12, the method further comprising:

applying a third reference drive voltage to a wordline of memory cells to generate a respective third resulting voltage level from each respective cell in the wordline;

detecting a second pattern of logic values stored in the modified memory;

for each respective third resulting voltage level output by each cell in the wordline, modifying the memory based on a third respective logic value indicated by the respective third resulting voltage level; and modifying at least one of the first reference drive voltage, the second reference drive voltage, or the third reference drive voltage based on the detected first pattern data or the detected second pattern data.

14. The method of claim 13, wherein the memory cells comprise triple level cell (TLC) flash memory cells, the method further comprising:

reading a respective central significant bit (CSB) of each of the memory cells.

15. The method of claim 13, wherein:

the bitwise logical operations between the second respective logic value and the corresponding logic value are first bitwise logical operations, and modifying the memory based on the third respective logic value comprises storing results of second bitwise logical operations between each third logic value and each respective logic value stored in the modified memory based on the second respective logic value.

16. The method of claim 15, wherein:

the bitwise logical operation between the negated second logic value and the corresponding logic value comprises an OR operation between the negated second logic value and the corresponding logic value; and the second bitwise logical operations between each third logic value and each respective logic value stored in the modified memory based on the second respective logic value comprise performing an AND operation between the respective third logic value and the respective logic value stored in the modified memory.

17. The method of claim 13, wherein:

detecting the first pattern of logic values stored in the memory comprises calculating a number of logical ones stored in the memory before modifying the memory based on the second respective logic value; and detecting the second pattern of logic values stored in the memory comprises calculating a number of logical ones stored in the memory after modifying the memory based on the second respective logic value and before modifying the memory based on the third respective logic value.

18. The method of claim 13, the method further comprising:

(a) applying a fourth reference drive voltage to a wordline of memory cells to generate a fourth respective resulting voltage level from each respective cell in the wordline;

(b) detecting a third pattern of logic values stored in the modified memory;

(c) for each respective fourth resulting voltage level output by each cell in the wordline, modifying the memory based on a fourth respective logic value indicated by the respective fourth resulting voltage level;

repeating steps (a)-(c) for any additional reference drive voltages; and modifying at least one of the reference drive voltages based on at least one of the detected pattern data.

19. A system, comprising:

a memory;

a wordline of memory cells configured to store data;

control circuitry configured to:

apply a first reference drive voltage to the wordline of memory cells to generate a respective first resulting voltage level from each respective cell in the wordline;

for each respective first resulting voltage level output by each cell in the wordline, store in the memory a first respective logic value indicated by the respective first resulting voltage level;

apply a second reference drive voltage to the wordline of memory cells to generate a respective second resulting voltage level from each respective cell in the wordline;

detect a pattern of logic values stored in the memory;

for each respective second resulting voltage level output by each cell in the wordline, modify the memory based on a second respective logic value indicated by the respective second resulting voltage level, wherein the circuitry is to modify the memory based on the second respective logic value by:

storing results of bitwise logical operations between the second respective logic value and a corresponding logic value of the stored first logic values, wherein the bitwise logical operations between the second respective logic value and the corresponding logic value comprise negating the respective second logic value and performing a bitwise logical operation between the negated second logic value and the corresponding logic value; and modify at least one of the first reference drive voltage and the second reference drive voltage based on the detected pattern data.

20. The system of claim 19, wherein the control circuitry is further configured to:

apply the modified first reference drive voltage and second reference drive voltage to the wordline of memory cells in future read operations.

21. The system of claim 19, wherein the control circuitry is configured to detect the pattern of logic values stored in the memory by calculating a number of logical ones stored in the memory.

22. The system of claim 19, wherein the memory comprises an array of latches, and wherein each latch of the array of latches is configured to store a logic value.

23. The system of claim 19, wherein the memory cells comprise multi-level flash memory cells that comprise at least two reference bits, and at most seven reference bits, and wherein the control circuitry is further configured to:

read at least one bit of each of the memory cells using more than one reference drive voltages.

24. The system of claim 19, wherein the pattern of logical ones is a first pattern, and wherein the control circuitry is further configured to:

apply a third reference drive voltage to a wordline of memory cells to generate a respective third resulting voltage level from each respective cell in the wordline;

detect a second pattern of logic values based on the second logic values stored in the modified memory;

for each respective third resulting voltage level output by each cell in the wordline, modify the memory based on a third respective logic value indicated by the respective third resulting voltage level; and modify at least one of the first reference drive voltage, the second reference drive voltage, or the third reference drive voltage based on the detected first pattern data or the detected second pattern data.

25. The system of claim 24, wherein the bitwise logical operations between the second respective logic value and the corresponding logic value are first bitwise logical operations, and wherein the control circuitry is configured to:

modify the memory based on the third respective logic value by storing results of second bitwise logical operations between each third logic value and each respective logic value stored in the modified memory based on the second respective logic value.

26. The system of claim 24, wherein the control circuitry is further configured to:

(a) apply a fourth reference drive voltage to a wordline of memory cells to generate a fourth respective resulting voltage level from each respective cell in the wordline;

(b) detect a third pattern of logic values stored in the modified memory;

(c) for each respective fourth resulting voltage level output by each cell in the wordline, modify the memory based on the fourth respective logic value indicated by the respective fourth resulting voltage level;

repeat steps (a)-(c) for any additional reference drive voltages; and modify at least one of the reference drive voltages based on at least one of the detected pattern data.

27. A non-transitory computer readable medium having non-transitory computer readable instructions encoded thereon that, when executed by circuitry, cause the circuitry to:

apply a first reference drive voltage to a wordline of memory cells to generate a respective first resulting voltage level from each respective cell in the wordline;

for each respective first resulting voltage level output by each cell in the wordline, store in memory a first respective logic value indicated by the respective first resulting voltage level;

apply a second reference drive voltage to the wordline of memory cells to generate a respective second resulting voltage level from each respective cell in the wordline;

detect a pattern of logic values stored in the memory;

for each respective second resulting voltage level output by each cell in the wordline, modify the memory based on a second respective logic value indicated by the respective second resulting voltage level, wherein the circuitry is to modify the memory based on the second respective logic value by:

storing results of bitwise logical operations between the second respective logic value and a corresponding logic value of the stored first logic values, wherein the bitwise logical operations between the second respective logic value and the corresponding logic value comprise negating the respective second logic value and performing a bitwise logical operation between the negated second logic value and the corresponding logic value; and modify at least one of the first reference drive voltage and the second reference drive voltage based on the detected pattern data.

* * * * *